(12) United States Patent
Tsukiji et al.

(10) Patent No.: US 6,643,308 B2
(45) Date of Patent: Nov. 4, 2003

(54) SEMICONDUCTOR LASER DEVICE AND METHOD FOR SUPPRESSING INJECTION CURRENT

(75) Inventors: Naoki Tsukiji, Tokyo (JP); Junji Yoshida, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/014,513

(22) Filed: Dec. 14, 2001

(65) Prior Publication Data
US 2003/0007527 A1 Jan. 9, 2003

(30) Foreign Application Priority Data

Jul. 6, 2001 (JP) ........................... 2001-206995

(51) Int. Cl.[7] ................................. H01S 5/00
(52) U.S. Cl. ............................. 372/46; 372/45
(58) Field of Search ................ 372/46, 45, 108, 372/43, 96

(56) References Cited

U.S. PATENT DOCUMENTS

| | | | | | |
|---|---|---|---|---|---|
| 4,829,535 | A | * | 5/1989 | Utaka | 372/50 |
| 4,873,691 | A | * | 10/1989 | Uomi et al. | 372/20 |
| 4,885,753 | A | * | 12/1989 | Okai et al. | 372/45 |
| 5,388,116 | A | | 2/1995 | Ohkubo et al. | |
| 5,960,023 | A | * | 9/1999 | Takahashi | 372/96 |
| 6,236,500 | B1 | * | 5/2001 | Suzuki et al. | 359/337.5 |
| 6,252,895 | B1 | * | 6/2001 | Nitta et al. | 372/50 |
| 6,330,265 | B1 | * | 12/2001 | Kinoshita | 372/50 |
| 6,384,963 | B2 | | 5/2002 | Ackerman et al. | |

FOREIGN PATENT DOCUMENTS

| | | |
|---|---|---|
| EP | 0 589 727 A2 | 3/1994 |
| EP | 0 589 727 B1 | 3/1994 |
| JP | 06-112584 | 4/1994 |
| JP | 07-263811 | 10/1995 |

* cited by examiner

*Primary Examiner*—Paul Ip
*Assistant Examiner*—Tuan Nguyen
(74) *Attorney, Agent, or Firm*—Oblon, Spivak, McClelland, Maier & Neustadt, P.C.

(57) ABSTRACT

A semiconductor device and method for providing a light source suitable for use as a pumping light source in a Raman amplification system are provided. The device upon which the method is based includes an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer, and a non-current injection area is formed along the diffraction grating so as to suppress injection current in the portion of the length of the active layer. The non-current injection area preferably has a length Li greater than a length Lg of the diffraction grating by an amount necessary to prevent scatter injection current from affecting the diffraction grating.

44 Claims, 18 Drawing Sheets

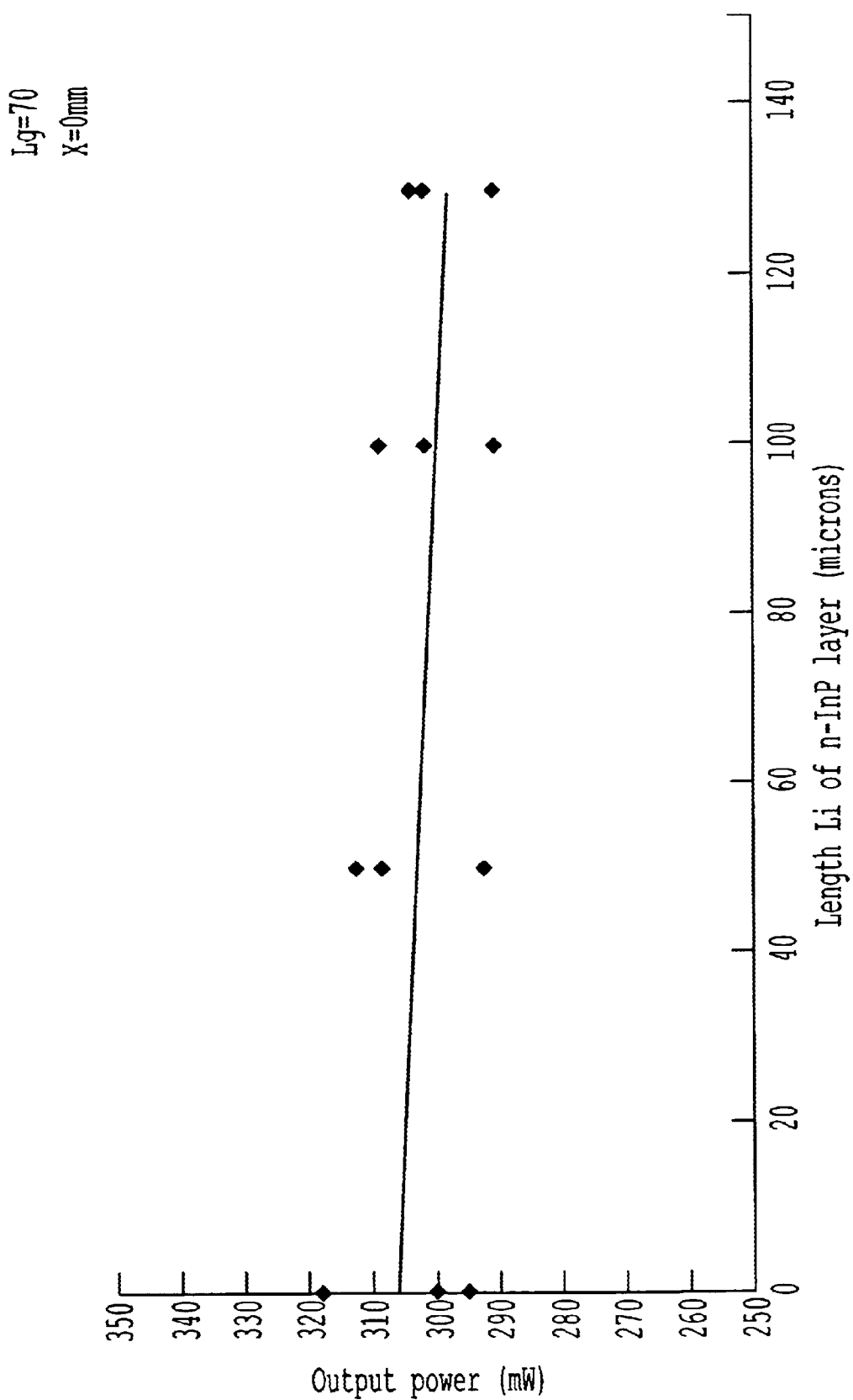

SEMICONDUCTOR LASER DEVICE AND METHOD FOR SUPPRESSING INJECTION CURRENT

FIELD OF THE INVENTION

The present invention relates generally to semiconductor laser device, and in particular to a semiconductor laser device used as a pumping source for an optical amplifier.

BACKGROUND OF THE INVENTION

With the proliferation of multimedia features on the Internet in the recent years, there has arisen a demand for larger data transmission capacity for optical communication systems. Conventional optical communication systems transmitted data on a single optical fiber at a single wavelength of 1310 nm or 1550 nm, which have reduced light absorption properties for optical fibers. However, in order to increase the data transmission capacity of such single fiber systems, it was necessary to increase the number of optical fibers laid on a transmission route, which resulted in an undesirable increase in costs.

In view of this, there has recently been developed wavelength division multiplexing (WDM) optical communications systems such as the dense wavelength division multiplexing (DWDM) system wherein a plurality of optical signals of different wavelengths can be transmitted simultaneously through a single optical fiber. These systems generally use an Erbium Doped Fiber Amplifier (EDFA) to amplify the data light signals as required for long transmission distances. WDM systems using EDFA initially operated in the 1550 nm band which is the operating band of the Erbium Doped Fiber Amplifier and the band at which gain flattening can be easily achieved. While use of WDM communication systems using the EDFA has recently expanded to the small gain coefficient band of 1580 nm, there has nevertheless been an increasing interest in an optical amplifier that operates outside the EDFA band because the low loss band of an optical fiber is wider than a band that can be amplified by the EDFA; a Raman amplifier is one such optical amplifier.

In a Raman amplifier system, a strong pumping light beam is pumped into an optical transmission line carrying an optical data signal. As is known to one of ordinary skill in the art, a Raman scattering effect causes a gain for optical signals having a frequency approximately 13 THz smaller than the frequency of the pumping beam. Where the data signal on the optical transmission line has this longer wavelength, the data signal is amplified. Thus, unlike an EDFA where a gain wavelength band is determined by the energy level of an Erbium ion, a Raman amplifier has a gain wavelength band that is determined by a wavelength of the pumping beam and, therefore, can amplify an arbitrary wavelength band by selecting a pumping light wavelength. Consequently, light signals within the entire low loss band of an optical fiber can be amplified with the WDM communication system using the Raman amplifier and the number of channels of signal light beams can be increased as compared with the communication system using the EDFA.

For the EDFA and Raman amplifiers, it is desirable to have a high output laser device as a pumping source. This is particularly important for the Raman amplifier, which amplifies signals over a wide wavelength band, but has relatively small gain. Such high output is generally provided by a pumping source having multiple longitudinal modes of operation. The Furukawa Electric Co., Ltd. has recently developed an integrated diffraction grating device that provides a multiple mode high output laser beam suitable for use as a pumping source in a Raman amplification system. An integrated diffraction grating device, as opposed to a fiber brag grating device, includes the diffraction grating formed within the semiconductor laser device itself. Examples of multiple mode integrated diffraction grating devices are disclosed in U.S. patent application Ser. Nos. 09/832,885 filed Apr. 12, 2001, 09/983,175 filed on Oct. 23, 2001, and 09/983,249 filed on Oct. 23, 2001, assigned to The Furukawa Electric Co., Ltd. and the entire contents of these applications are incorporated herein by reference. Where Raman amplification is used in a WDM communication system, the amplification gain characteristic of the Raman amplifier may be changed depending on the wavelength number of the input signal light. However, it is desirable for the Raman amplifier to have a relatively flat gain characteristic over a wide wavelength range including the entire wavelength range of the WDM signal. Such a flat gain characteristic is achieved by feed back control of the pumping laser output in the Raman amplification system. FIG. 19 is a block diagram illustrating a configuration of a Raman amplifier used in a WDM communication system and having a feedback control to provide a flat Raman amplification gain characteristic.

In FIG. 19, semiconductor laser modules 60a through 60d provide pump laser outputs. The laser modules 60a and 60b output laser beams having the same wavelength via polarization maintaining fiber 71 to polarization synthesizing coupler 61a. Similarly, laser beams outputted by each of the semiconductor laser modules 60c and 60d have the same wavelength, and they are polarization-multiplexed by the polarization-synthesizing coupler 61b. Each of the laser modules 60a through 60d includes an integrated semiconductor laser device such as those disclosed in U.S. patent application Ser. No. 09/832,885, Ser. No. 09/983,175, and Ser. No. 09/983, and, therefore, outputs a laser beam having a plurality of oscillation longitudinal modes to a respective polarization-multiplexing coupler 61a and 61b via a polarization maintaining fiber 71. In addition, the light output of each laser device is monitored by a photodiode (not shown) in order to allow control of the laser module outputs as will be further described below.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61a and 61b, and outputs the multiplexed light beams as a pumping light beam to amplifying fiber 64 via WDM coupler 65. Signal light beams to be amplified are input to amplifying fiber 64 from signal light inputting fiber 69 via polarization-independent isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70.

The control circuit 68 controls the optical output of each of the semiconductor laser modules 60a–60d based on the monitored Raman amplifier output in order to maintain a flat gain characteristic of the Raman amplifier. More specifically, the control circuit 68 controls the driving current, and therefore the output, of each of the semiconductor laser devices in the laser modules 60a–60d, based on the Raman amplifier output. Thus, the control circuit 68 must also have information about the output level of each semiconductor laser device. As noted above, the optical output intensity of these semiconductor devices is monitored by a photodiode that produces a monitor current based on a portion of the light output detected from the back end (non emitting surface) of the laser device. However, the present inventors have discovered that for integrated diffraction grating laser devices, a stepwise or waving fluctuation in monitor current occurs with an increase in optical output of the laser device.

For example, FIG. 20A and FIG. 20B are diagrams showing the optical output (Lo) dependency of the monitor current (Im). With the optical output dependency of the monitor current shown in FIG. 20A, when the optical output exceeds a certain level, waving and fluctuation occur with an increase of the optical output. On the other hand, with the optical output dependency of the monitor current shown in FIG. 20B, when the optical output exceeds a certain level, the monitor current increases stepwise with an increase of the optical output. These fluctuations in the monitor current makes it difficult to know the instantaneous output intensity of the semiconductor laser devices thereby making it difficult to perform stable optical amplification control.

SUMMARY OF THE INVENTION

Accordingly, one object of the present invention is to provide a laser device and method for providing a light source suitable for use as a pumping light source in a Raman amplification system, but which overcomes the above described problems. Another object of the present invention is to provide a laser device that provides a smooth increase in monitor current for an increase in optical output thereby making the optical amplification control simple and easy.

According to a first aspect of the present invention, a semiconductor device and method for providing a light source suitable for use as a pumping light source in a Raman amplification system are provided. The device upon which the method is based includes an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer, and a non-current injection area is formed along the diffraction grating so as to suppress injection current in the portion of the length of the active layer. The non-current injection area preferably has a length Li greater than a length Lg of the diffraction grating by an amount necessary to prevent scatter injection current from affecting the diffraction grating.

The non-current injection area may be an insulating film formed along the diffraction grating, an area along the diffraction grating where an electrode or contact layer is excluded, or a current blocking layer or impurity region forming a diode junction that blocks the injection current. An impurity region may also be used as a high resistance region for suppressing injection current. The non-current injection area may include an insulating film formed along the diffraction grating and having a slot portion that penetrates the contact layer to separate the contact layer into two parts. The laser device may further include a slot penetrating and electrode, a contact layer, and a cladding layer to bifurcate the electrode and contact layers thereby forming separate electrode structures. In this device the non-current injection area is one of the electrode structures to which no injection current is applied.

According to another aspect of the invention, a semiconductor laser module, an optical amplifier, a Raman amplifier, or a wavelength division multiplexing system may be provided with a semiconductor laser device having an active layer configured to radiate light, a light reflecting facet positioned on a first side of the active layer, and a light emitting facet positioned on a second side of the active layer thereby forming a resonator between the light reflecting facet and the light emitting facet. A diffraction grating is positioned within the resonator along a portion of the length of the active layer, and a non-current injection area is formed along the diffraction grating so as to suppress injection current in the portion of the length of the active layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7F shows the effect on output power of a semiconductor laser device as the length Li of the current blocking layer increases from 0 to 130 $\mu$m.

DESCRIPTION OF THE PREFERRED EMBODIMENTS

Figure 1:
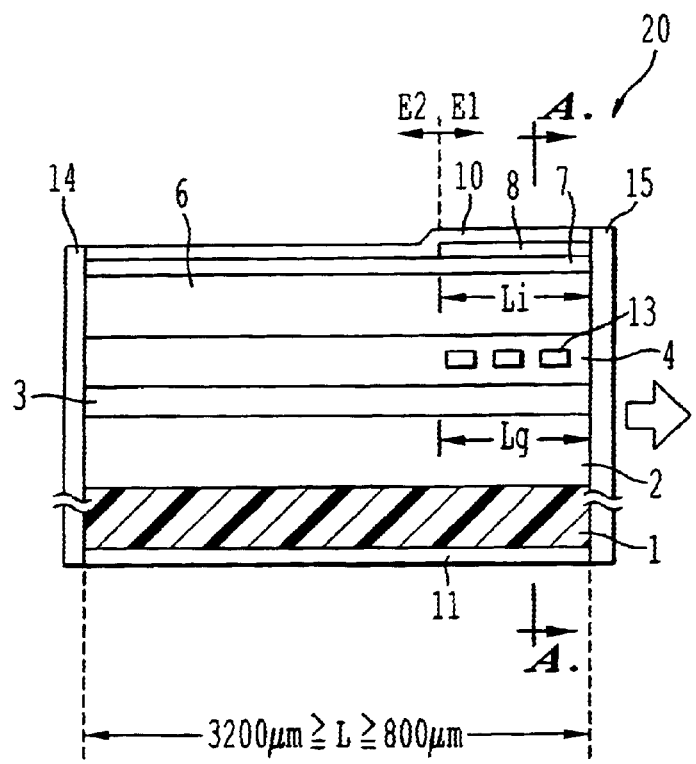
FIG. 1 is a vertical sectional view in the longitudinal direction of a semiconductor laser according to a first embodiment of the present invention.
Figure 2:
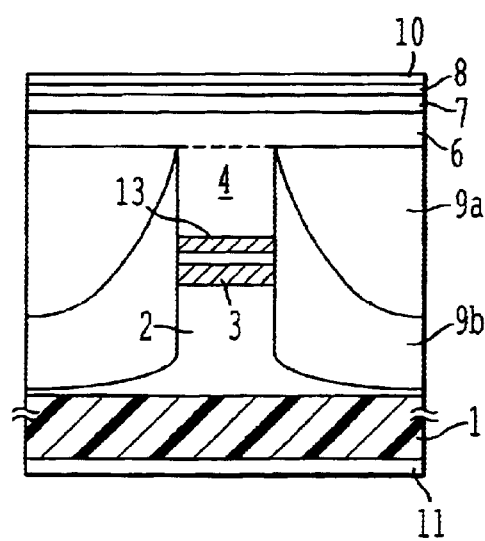
FIG. 2 is a cross sectional view along the line A—A of the semiconductor laser device shown in FIG. 1.

Referring now to the drawings wherein like elements are represented by the same reference designation throughout, and more particularly to FIGS. 1 and 2 thereof, there is shown a semiconductor laser device for providing a light source suitable for use as a pumping light source in a Raman amplification system in accordance with a first embodiment of the present invention. FIG. 1 is a vertical sectional view in the longitudinal direction of the semiconductor laser device, and FIG. 2 is a cross sectional view of the semiconductor laser device, taken along the line A—A in FIG. 1.

The semiconductor laser device 20 of FIGS. 1 and 2 includes an n-InP substrate 1 having an n-InP buffer layer 2, an active layer 3, a p-InP spacer layer 4, a p-InP cladding layer 6, and an InGaAsP contact layer 7 sequentially stacked on a face (100) of the substrate 1. Buffer layer 2 serves both as a buffer layer by the n-InP material and an under cladding layer, while the active layer 3 is a graded index separate confinement multiple quantum well (GRIN-SCH-MQW). A diffraction grating 13 of a p-InGaAsP material is periodically formed within the p-InP spacer layer 4 along a portion of the entire length of active layer 3. The diffraction grating 13 of the embodiment of FIG. 1 has a length Lg of approximately 50 $\mu$m, a film thickness of 20 nm, a pitch of 220 nm, and selects a laser beam having a central wavelength of 1480 nm, to be emitted by the semiconductor laser device 20.

As best seen in FIG. 2, the p-InP spacer layer 4 having the diffraction grating 13, the GRIN-SCH-MQW active layer 3, and the upper part of the n-InP buffer layer 2 are processed in a mesa strip shape. The sides of the mesa strip are buried by a p-InP blocking layer 9b and an n-InP blocking layer 9a formed as current blocking layers. An insulating film 8 is formed on the upper surface of the InGaAsP contact layer 7 in the vicinity of the diffraction grating as seen in FIG. 1. The insulating layer 8 has a length Li of approximately 60 $\mu$m and is preferably formed of SiN, however, other materials having good thermal conductivity, such as AlN, $Al_2O_3$, MgO or $TiO_2$, may be used for the insulating material 8. The insulating film 8 functions to prevent the current from being injected to the mesa stripe structure below the insulating film 8, and may be a stripe shape having a width exceeding the width of the mesa stripe structure.

In addition, a p-side electrode 10 is formed on the upper surface of InGaAsP cap layer 7, and an n-side electrode 11 is formed on the back surface of n-InP substrate 1. The p-side electrode is formed on the upper surface of the insulating film 8 and contact layer 7 where no insulating layer exists. In a preferred embodiment, a bonding pad (not shown) having a thickness of about 5 $\mu$m may be formed on the p-side electrode 10. For example, when the semiconductor laser device is assembled with a junction down method, this bonding pad serves as a buffer material for alleviating the shock at the time of assembly. Therefore, wraparound of a solder is prevented at the time of joining to a heat sink, and hence a short-circuit due to the wraparound of the solder can be prevented. This benefit will be further described with respect to FIG. 13 below.

As seen in FIG. 1, reflective film 14 having high reflectivity of, for example, 80% or more, and preferably 98% or more is formed on a light reflecting end surface that is one end surface in the longitudinal direction of the semiconductor laser device 20. Antireflection coating 15 having low reflectivity of, for example, less than 2% and preferably less than 0.1%, is formed on a light irradiating end surface opposing the light reflecting end surface of semiconductor laser device 20. The reflective film 14 and the antireflection coating 15 form a light resonator within the active region 3 of the semiconductor laser device 20. A light beam generated inside the GRIN-SCH-MQW active layer 3 of the light resonator is reflected by the reflective film 14 and irradiated as an output laser beam via the antireflection coating 15. As seen in FIG. 1, the resonator length L is preferably from 800–3200 $\mu$m in order to provide multiple longitudinal modes within the gain profile of the laser device.

Thus, in the first embodiment, the insulating film 8 is formed on the upper part of the diffraction grating 13, and between the InGaAsP contact layer 7 and the p-side electrode 10, from the outgoing side reflection coating 15 towards the reflection coating 14, in a length Li=60 $\mu$m. The present inventors have recognized that with this configuration the injected current applied from the p-side electrode 10 towards the n-side electrode 11 flows below the area that is not covered with the insulating film 8, but is suppressed below the area covered with the insulating film 8. Therefore, as seen in FIG. 1, the semiconductor laser device of the present invention includes a current injection area $E_2$ and a non-current injection area $E_1$ along the diffraction grating 13. The present inventors have discovered that this non-current injection area along the grating provides several advantages over laser devices not including the area $E_1$.

Figure 3A:
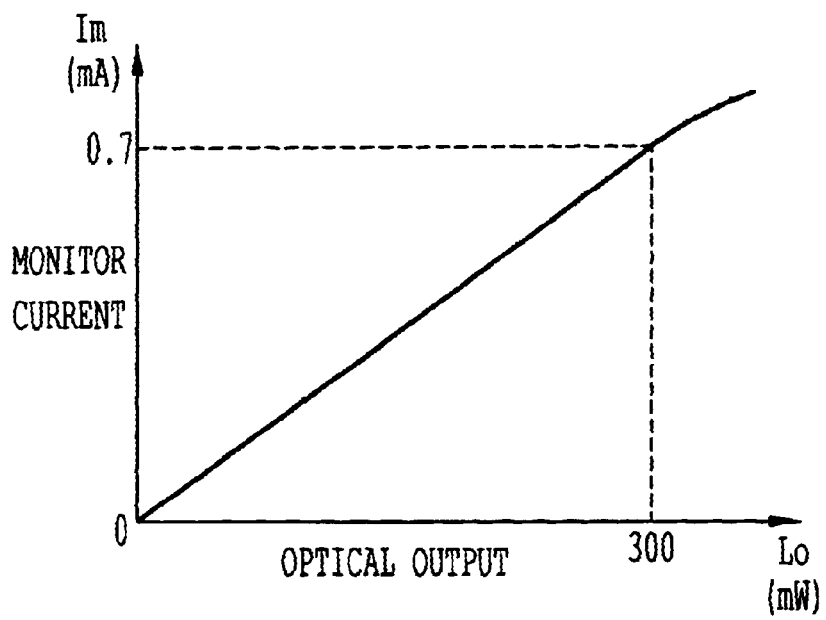
FIG. 3A is a diagram showing the optical output dependency of the monitor current in a semiconductor laser device according to the first embodiment of the present invention.
Figure 20A:
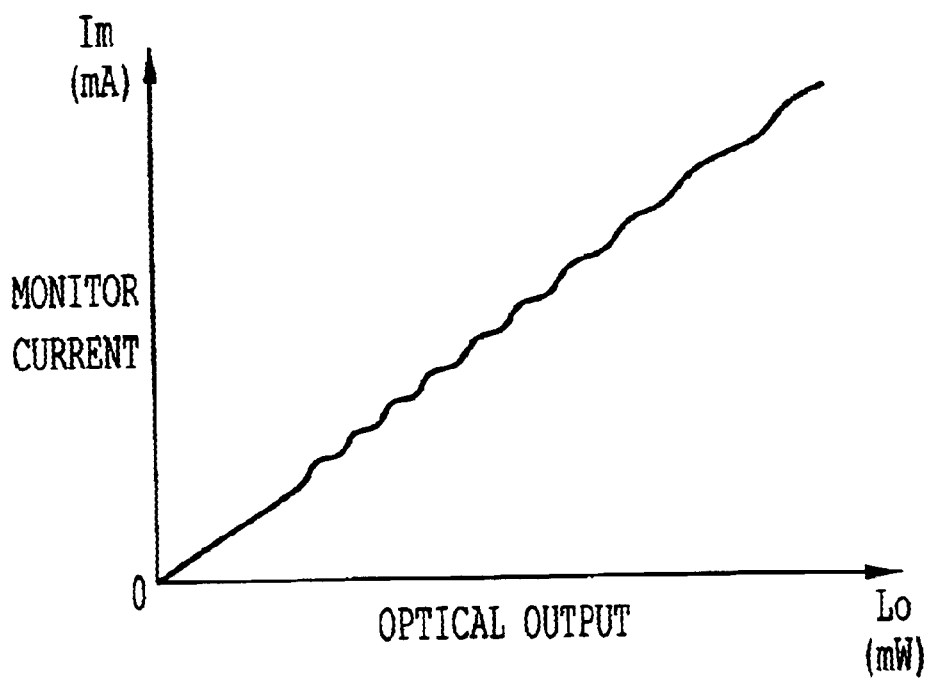
FIGS. 20A and 20B are diagrams showing the optical output dependency of the monitor current in a conventional semiconductor laser device.
Figure 20B:
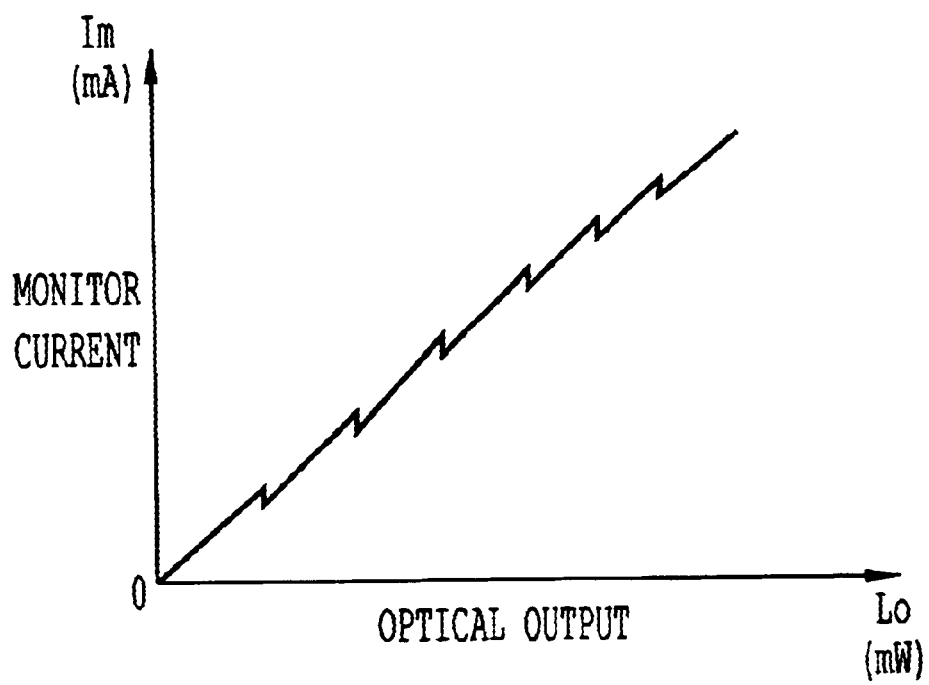

First, suppression of the current injected into the vicinity of the diffraction grating 13 provides a monitor current that increases monotonically for increases in optical output of the semiconductor laser devices. As described with respect to FIGS. 20A and 20B above, for conventional integrated diffraction grating devices, a monitor current includes wave or stepwise variations with an increase in the output intensity of the pump laser making it difficult to perform feedback optical amplification control. However, as shown in FIG. 3, the semiconductor laser device 20 according to the present invention provides a smooth increase in monitor current for an increase in optical output thereby making the optical amplification control simple and easy. This is due to the non-current injection area decreasing the temperature in the area of the diffraction grating and therefore decreasing the mode hopping that causes the stepwise variation in monitor current for devices not including the non-current injection area.

More specifically, with the conventional semiconductor laser device not having a non-current injection area formed therein, the semiconductor laser device having the optical output dependency of the monitor current shown in FIG. 3 can be obtained in about 20% of the devices manufactured. However, by forming the non-current injection area $E_1$ shown in the first embodiment, the semiconductor laser device having the optical output dependency of the monitor current shown in FIG. 3 can be obtained by about 70% of the devices manufactured. Thus, the semiconductor laser device of the present invention can be made at a substantially higher yield than that of the conventional devices As shown in FIG. 1, the length Li of the insulating film 8 is preferably a length exceeding the length Lg of the diffraction grating 13. However, if the length Li of the insulating film 8 is made too long, the portion of the GRIN-SCH-MQW active layer 3 in the current injection area E2 decreases, thereby effecting a decrease in the output of the laser beam. As a result, it is desired that the length Li of the insulating film 8 be a length exceeding the length of the diffraction grating 13 by an amount necessary to prevent scatter current in the current injection area E2 from affecting diffraction grating 13. Therefore, in this first embodiment, the length Li of the insulating film 8 is made to be 60 $\mu$m, which is longer than the length Lg=50 $\mu$m of the diffraction grating 13 by 10 $\mu$m.

The present inventors have also determined that the non-current injection area does not significantly affect the output power of the laser device according to the first embodiment of the invention. The GRIN-SCH-MQW active layer 3 in the current injection area E2 emits light due to the injected current, while the GRIN-SCH-MQW active layer 3 in the non-current injection area E1 performs photon recycle by means of the light from the GRIN-SCH-MQW active layer 3 in the current injection area E2. Hence, even if there is no injected current in the area E1, this area serves as a buffer amplifier for transmitting and outputting the laser beam to the outgoing side reflection coating 15, and hence, the laser beam is not attenuated. Moreover, the non-current injection area E1 is relatively small compared to the resonator length. Specifically, the resonator length L for the laser device is from 800 to 3200 $\mu$m as noted above, while the non-current injection area formed by the insulating film 8 is only about 60–150 $\mu$m. As a result, the laser output of the semiconductor laser device 20 in this first embodiment can be maintained substantially at the same level as that of the semiconductor laser device in which the non-current injection area E1 is not formed.

The present inventors have further recognized that the non-current injection area E1 prevents catastrophic optical damage COD on the light emitting facet side of the GRIN-SCH-MQW active layer 3. COD occurs when injection current in the area of the antireflective coating 15 causes the light-emitting facet to increase in temperature and therefore reduce in bandgap. The reduction in bandgap causes greater light absorption by the facet which further increases the temperature of the facet. Thus, a positive temperature feedback cycle occurs thereby melting and destroying the light-emitting facet with antireflective coating 15. A discussion of COD may be found in U.S. Pat. No. 5,388,116, the entire contents of which is incorporated herein by reference. In the first embodiment, since the facet of the outgoing side antireflection coating 15 is within the non-current injection area E1, the injected current is suppressed thereby reducing heat, and it is expected that the probability of COD can be reduced. In this regard, it is noted that the InP type semiconductor laser device generally does not experience COD as compared to the GaAs type laser. However, with a semiconductor laser device having high output of about 300 mW or higher, a temperature rise on the light-emitting facet will cause COD, even in the InP type laser device.

Figure 4A:
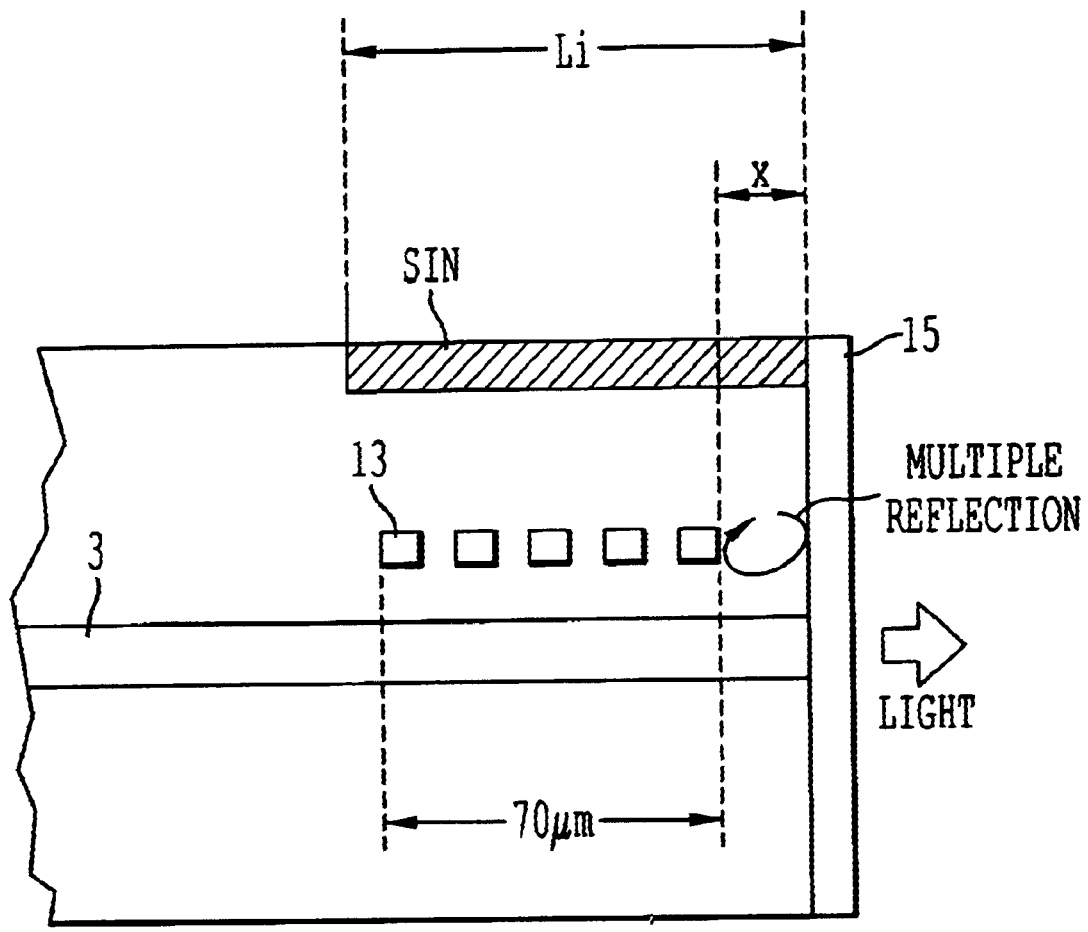
FIG. 4A shows a multiple reflection phenonenon that occurs in a semiconductor laser device having a current suppression region in accordance with the present invention.

Yet another effect of the present invention is that the existence of kinks in the I-L curve depends on the distance of the diffraction grating material from the light emitting facet of the semiconductor laser device. FIG. 4A shows a multiple reflection phenonenon that occurs in a semiconductor laser device having a current suppression region in accordance with the present invention. The device includes an active region 3, a diffraction grating 13, a SiN insulating film, and a light emitting facet 15. Other structural features of the laser device are omitted from FIG. 4A for the sake of explanation. As seen in FIG. 4A, a length of the grating material of the diffraction grating 13 is fixed at 70 $\mu$m, a length of the SiN material is designated Li, and a distance between the end of the grating material and the facet 15 is designated X. The present inventors have discovered that where X is a nonzero value (i.e. the grating material is not in contact with the facet), multiple reflections occur between the facet 15 and the grating material of the grating 13 as labeled in FIG. 4A causing undesirable kinks in the IL curve of the laser device. Such kinks are readily identified by the use of a slope efficiency curve of the laser device, which results from the first-order differential operation carried out on the I-L curve of the device.

Figure 4B:
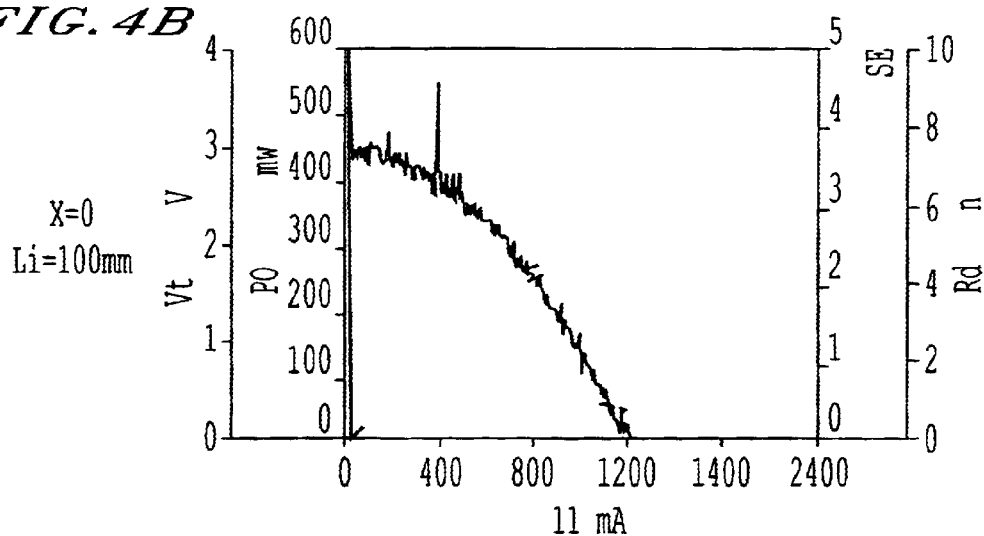
FIGS. 4B–4D show slope efficiency curves for three laser devices according to the first embodiment, each having 70 $\mu$m of grating material, but having the grating material positioned at different distances from the light emitting facet, and having different lengths of insulating material.
Figure 4C:
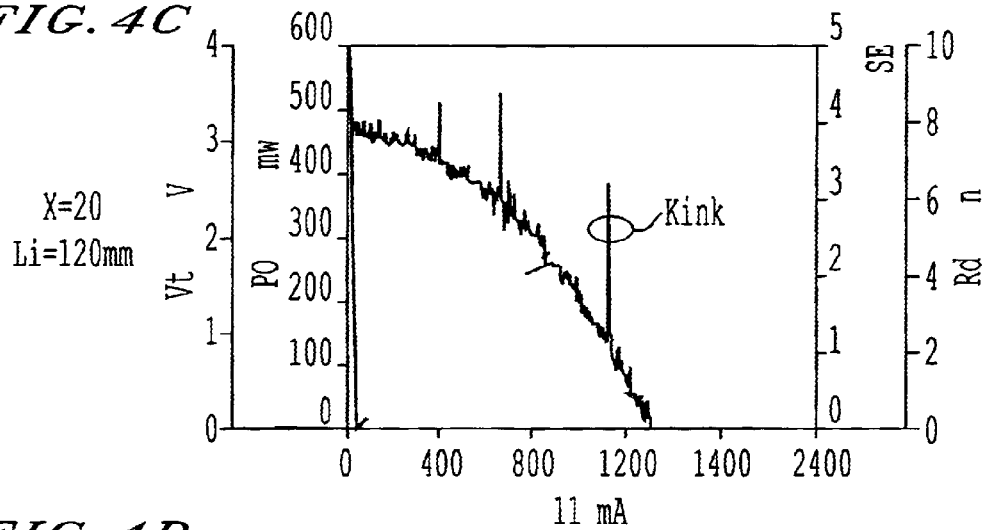
Figure 4D:
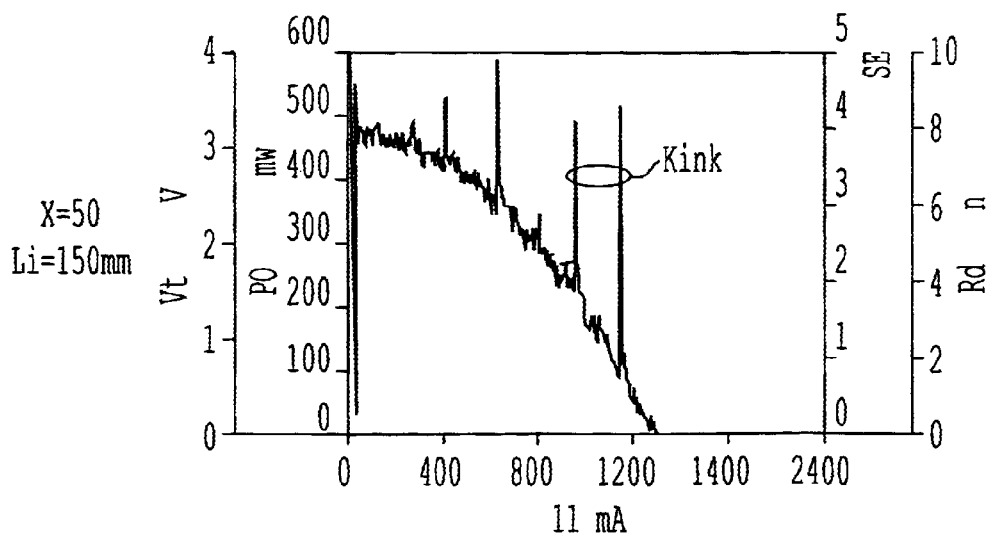

FIGS. 4B–4D show slope efficiency curves for three laser devices each having 70 $\mu$m of grating material, but having the grating material positioned at different distances from the light emitting facet, and having different lengths of insulating material 8. As seen in FIG. 4B, a device having the diffraction grating in contact with the light emitting facet X=0, and having an insulating length Li=100 $\mu$m has only one small kink occurring only at low driving currents. However, as seen in FIGS. 4B and 4C, increasing the distance of the grating material from the light emitting facet will produce larger and more frequent kinks in the I-L curve despite an equal increase in the length of the insulating material Li. Thus, the present inventors have discovered that for devices having a current suppression region, it is desireable to make the grating material contact the light emitting facet of the device.

Figure 3B:
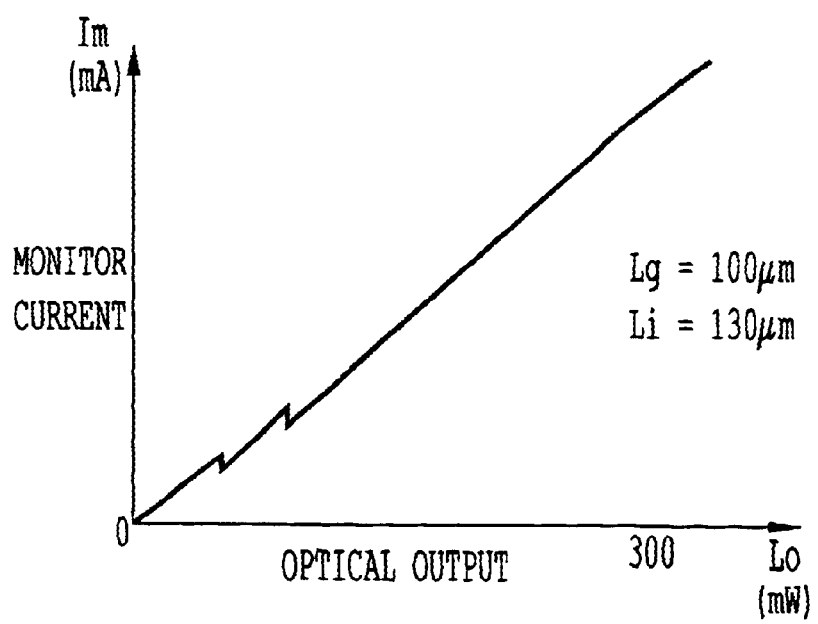
FIG. 3B is a diagram showing the optical output dependency of the monitor current in a semiconductor laser device having a diffraction grating length of 100 $\mu$m according to an embodiment of the present invention.

With the semiconductor laser device 20 shown in FIG. 1 and FIG. 2, the length Lg of the diffraction grating 13 is about 50 $\mu$m, and the length Li of the insulating film 8 is about 60 $\mu$m. However, the present inventors have found that improved monitor current to light output relationship can be obtained for longer diffraction gratings. Specifically, FIG. 3B shows the optical output dependency of the monitor current in the case where the length Lg of the diffraction grating 13 is about 100 $\mu$m, and the length Li of the insulating film 8 is about 130 $\mu$m. As shown in FIG. 3B, even if the length Lg of the diffraction grating 13 is as long as 100

μm, by providing non-current injection area E1 using the insulating film 8, fluctuation of the monitor current Im occurs only at very low optical outputs, but does not occur in the high output area of the optical output Lo. While this longer grating semiconductor laser device cannot be put into a practical use for low power applications, where high output is required, such as for optical amplification, the semiconductor laser device is suitable for practical use. That is to say, by providing the insulating film 8 to form the non-current injection area along relatively long diffraction gratings, the optical output dependency of the monitor current is improved.

Figure 5:
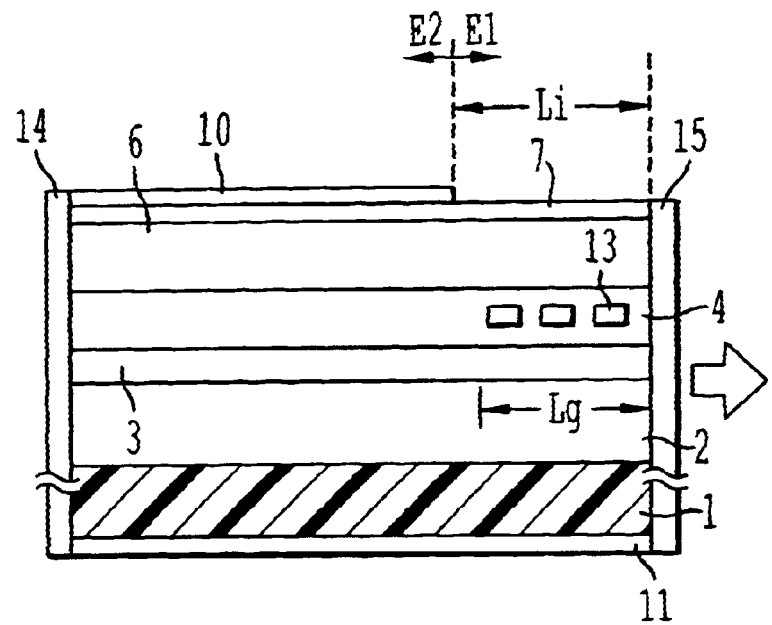
FIG. 5 is a vertical sectional view in the longitudinal direction of a semiconductor laser device according to a second embodiment of the present invention.

In the first embodiment, the semiconductor laser device 20 has the diffraction grating 13 formed along the GRIN-SCH-MQW active layer 3, but the present invention is not limited thereto. It is obvious that the present invention is applicable to a semiconductor laser device having an optical guided wave path adjacent to the active layer, and the diffraction grating is formed along this optical guided wave path. FIG. 5 is a vertical sectional view in the longitudinal direction of the semiconductor laser device according to a second embodiment of the present invention. As described in the first embodiment above, the non-current injection area E1 is provided by the insulating film 8 formed along the diffraction grating 13. As seen in FIG. 5, however, the non-current injection area E1 of the second embodiment is formed by a partial p-side electrode 10. Specifically, the semiconductor laser device of FIG. 5 includes an InGaAsP contact layer 7 formed upon the p-InP cladding layer 6. The p-side electrode 10 is then formed on the upper surface of this InGaAsP contact layer 7, except in the area of the diffraction grating 13. The diffraction grating 13 of the second embodiment has a length Lg=50 μm and the area Li where the electrode 10 is omitted is approximately 60 μm. Therefore, non-current injection area E1 is formed along the diffraction grating 13, thereby achieving the same advantages described with respect to the first embodiment above.

Figure 6:
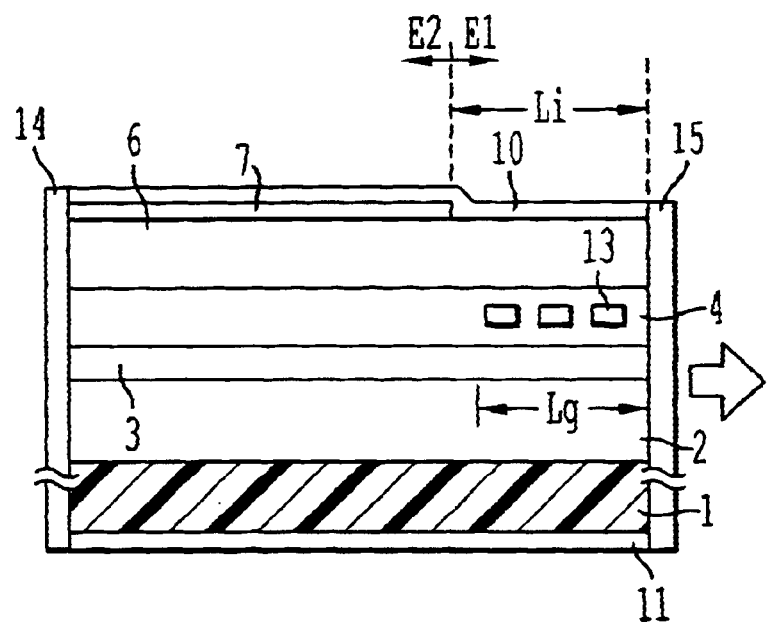
FIG. 6 is a vertical sectional view in the longitudinal direction of a semiconductor laser device according to a third embodiment of the present invention.

FIG. 6 is a vertical sectional view in the longitudinal direction of the semiconductor laser device according to a third embodiment of the present invention. As seen in this figure, the non-current injection area E1 of the third embodiment is formed by a partial contact layer 7. Specifically, the semiconductor laser device of FIG. 6 includes a contact layer 7 formed upon the p-InP cladding layer 6 except in the vicinity of the diffraction grating 13. The p-side electrode 10 is then formed on the upper surface of the partial contact layer 7 and the exposed cladding layer 6. As a result, the p-side electrode 10 and the p-InP cladding layer 6 are in direct contact along diffraction grating 13 thereby providing a high value of resistance in this area. However, the p-side electrode 10 and the p-InP cladding layer 6 joined via the InGaAsP contact layer 7 have a low value of resistance. The diffraction grating 13 of the third embodiment has a length Lg=50 μm and the area Li where the contact layer is omitted is approximately 60 μm. Therefore, non-current injection area E1 is formed along the diffraction grating 13 thereby achieving the same advantages described with respect to the first embodiment above.

Figure 7A:
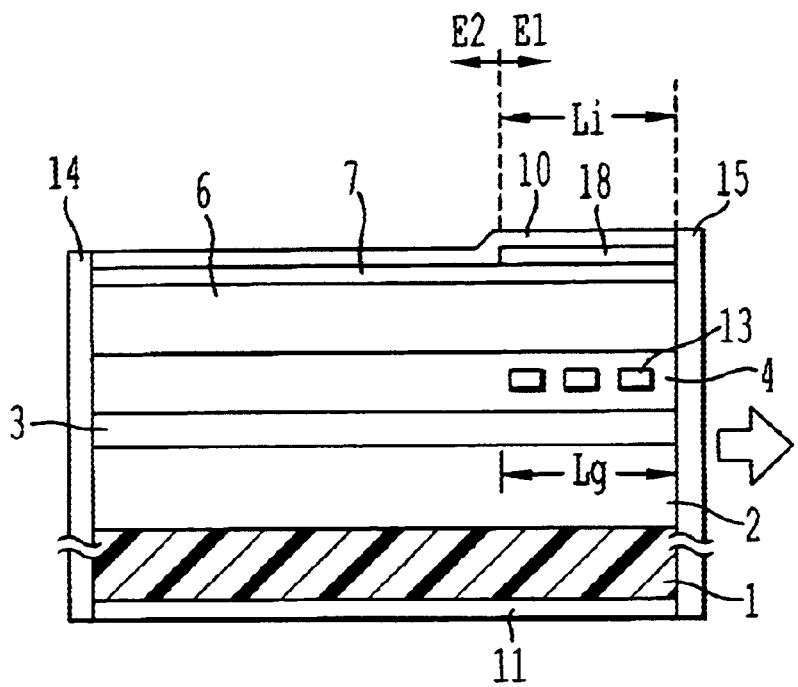
FIG. 7A is a vertical sectional view in the longitudinal direction of a semiconductor laser device according to a fourth embodiment of the present invention.

FIG. 7A is a vertical sectional view in the longitudinal direction of the semiconductor laser device according to a fourth embodiment of the present invention. As seen in this figure, the non-current injection area E1 of the fourth embodiment is formed by a current blocking layer 18. Specifically, the semiconductor laser device of FIG. 7 includes a contact layer 7 formed upon the p-InP cladding layer 6. An n-InP layer 18 is then formed on the contact layer 7 to form a current blocking layer along the diffraction grating 13. The p-side electrode 10 is then formed on the upper surface of the exposed contact layer 7 and the blocking layer 18. As a result, the junction between the n-InP layer 18 and the p-InP cladding layer 6 is a reversed bias p-n junction along the diffraction grating 13, and serves as a current blocking layer in this area. The diffraction grating 13 of the third embodiment has a length Lg=50 μm and the area Li of the current blocking layer 18 is approximately 60 μm. Therefore, non-current injection area E1 is formed along the diffraction grating 13 thereby achieving the same advantages described with respect to the first embodiment above.

Figure 7B:
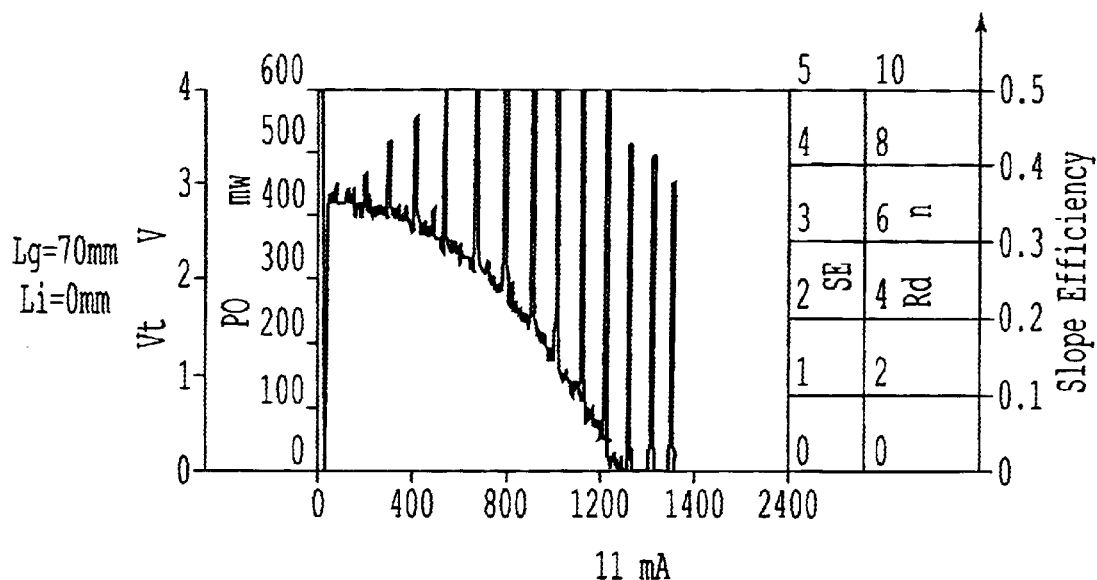
FIGS. 7B–7E show slope efficiency curves for four laser each having 70 $\mu$m of grating material, but having increasing lengths Li of current blocking material 18 according to the fourth embodiment of the present invention.
Figure 7C:
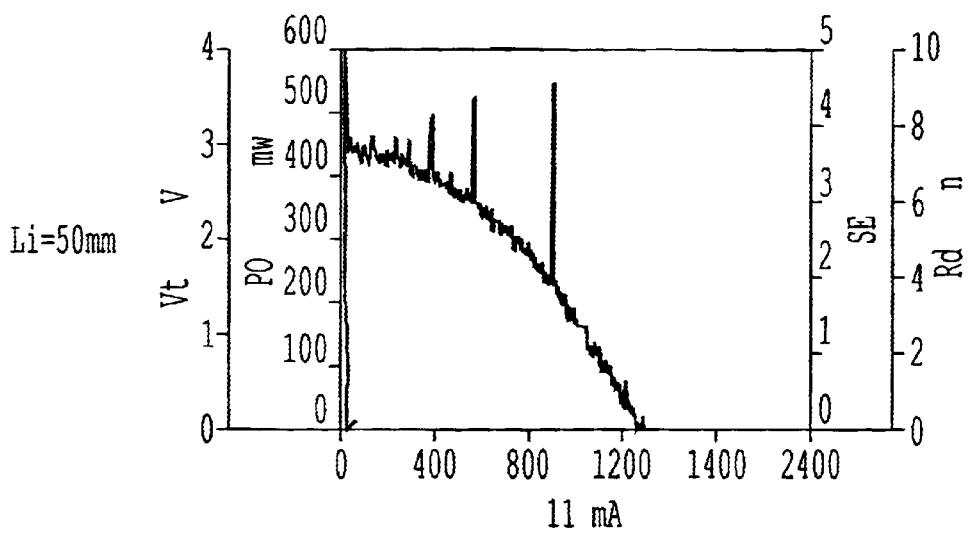
Figure 7D:
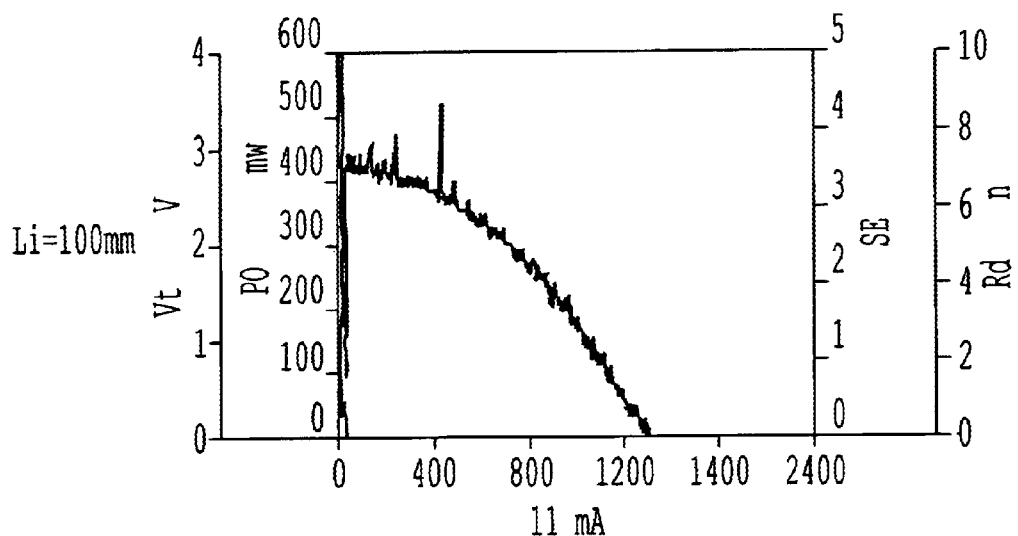
Figure 7E:
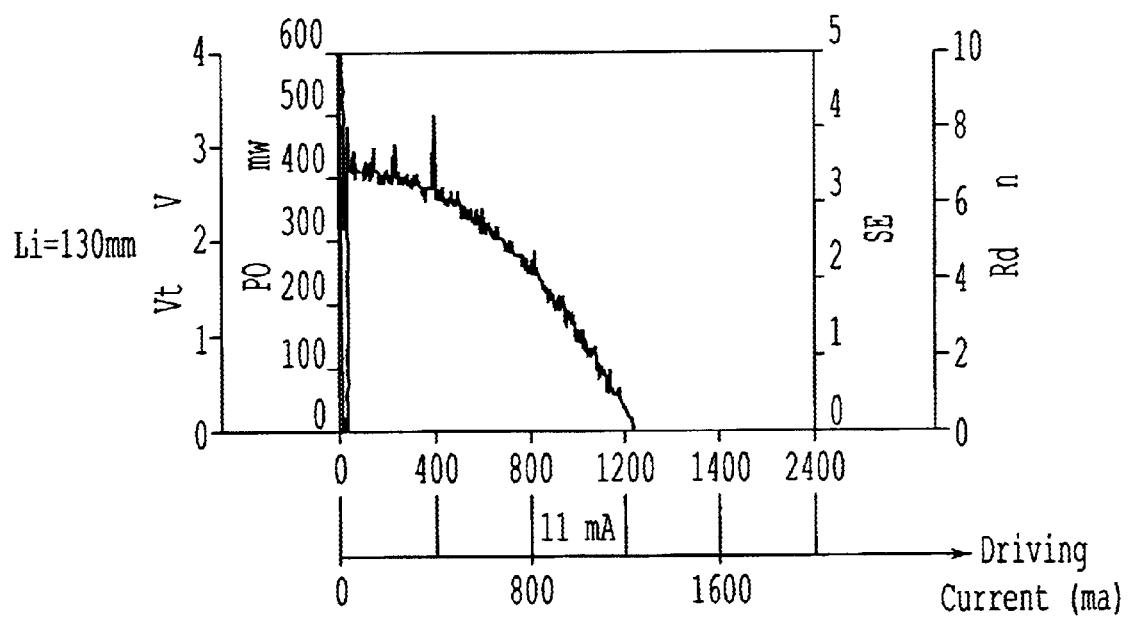

FIGS. 7B–7E show slope efficiency (dL/dI) curves for four laser devices each having 70 μm of grating material, but having increasing lengths Li of current blocking material 18 according to the fourth embodiment of the present invention. As seen in FIG. 7B, a device having no current blocking material (i.e. Li=0) produces many very large kinks occurring at low and high driving currents for the device. However, as seen in FIGS. 7C through 7E, increasing the length Li of the current blocking layer 18 produces fewer and smaller kinks that occur primarily at low driving currents for the laser device. Thus, the fourth embodiment of the present invention shown in FIG. 7 provides an advantage in that kinks in the I-L curve are reduced and confined mainly to low driving currents due to the current blocking layer 18. Moreover, FIG. 7F shows that the increasing length Li of the current blocking layer 18 in the fourth embodiment does not produce a significant decrease in the output power of the laser device.

Specifically, FIG. 7F shows the effect on output power of a semiconductor laser device as the length Li of the current blocking layer 18 increases from 0 to 130 μm. Specifically, FIG. 7F includes four sets of data points corresponding to four laser devices having a length Li of 0 μm, 50 μm, 100 μm, and 130 μm respectively. The devices tested had a diffraction grating length Lg of 70 μm and the grating material of the diffraction grating in contact with the light emitting facet (i.e. the antireflective coating 15 in FIG. 7). Also, each of the devices was tested at three different injection currents thereby providing the three data plots positioned vertically on the graph for each device. The solid line in FIG. 7F represents the average of the four sets of data points. As seen by this solid line, increasing the length Li of the current blocking layer 18 does not result in a significant decrease in output power of the devices with an increase in the length Li.

As described, in the construction of the fourth embodiment, the contact resistance between the n-InP layer 18 and the electrode 10 increases due to reverse bias occuring between the n-InP layer 18 and the InGaAsP contact layer 7, and thereby the current injection to the lower part of the n-InP layer 18 is suppressed. However, the same affect may be achieved by using different materials for layer 18. instead of layer 18 being an n-InP layer, an i-InP (intrinsic InP) layer, a p-InP layer, an n-InGaAsP layer, an i-InGaAsP layer, n-InGaAs layer, or an i-InGaAs layer may be formed to increase the contact resistance, and suppress current injection to the vicinity of the diffraction grating 13. Each of these materials will form a non-current injection area E1 along the diffraction grating 13 thereby achieving the same advantages described with respect to the first embodiment above.

Figure 8:
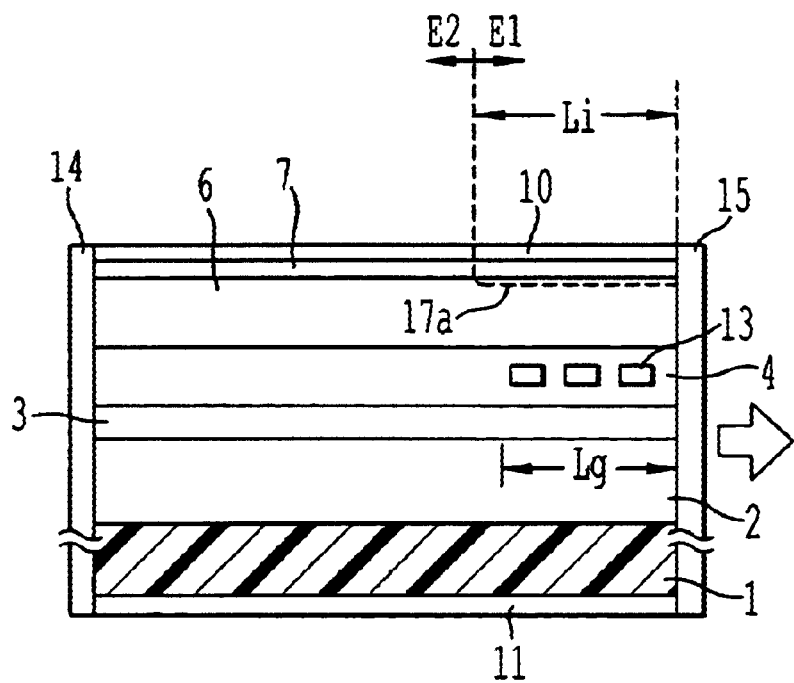
FIG. 8 is a vertical sectional view in the longitudinal direction of a semiconductor laser device according to a fifth embodiment of the present invention.

FIG. 8 is a vertical sectional view in the longitudinal direction of the semiconductor laser device according to a fifth embodiment of the present invention. As described in the fourth embodiment in FIG. 7 above, the non-current injection area E1 is formed by the n-InP layer 18 formed in the vicinity of the diffraction grating 13. However, in FIG. 8, the non-current injection area E1 is formed by diffusing impurities into the InGaAsP contact layer 7 and cladding layer 6. Specifically, the semiconductor laser device of FIG. 8 includes a contact layer 7 formed upon the p-InP cladding layer 6. N-type impurities are then added and scattered to the contact layer 7 and the cladding layer 6 along the diffraction grating 13 to change the contact layer 7 to an n-type material and form n type diffusion 17a in the area Li of the diffraction grating 13. As a result, a reverse bias p-n junction is formed along the diffraction grating 13, without providing a separate n-InP layer 18. Addition and scattering of the n-type impurities can be performed by a combination of various methods such as ion implantation, annealing, etc. The diffraction grating 13 of the fifth embodiment has a length Lg=50 μm and the area Li where diffusion is made is 60 μm. Therefore, current injection to the vicinity of the diffraction grating 13 is suppressed, thereby achieving the same advantages described with respect to the first embodiment above.

Figure 9:
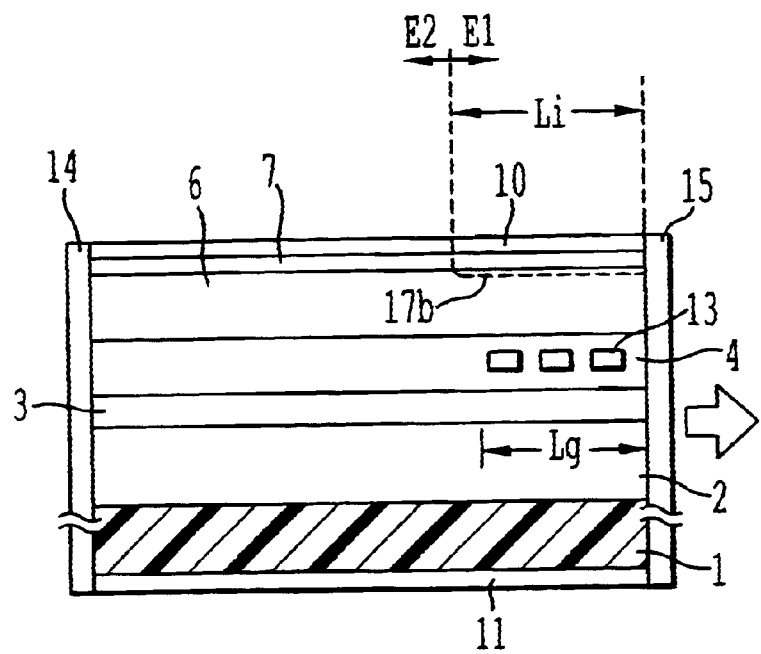
FIG. 9 is a vertical sectional view in the longitudinal direction of a semiconductor laser device according to a sixth embodiment of the present invention.
Figure 10:
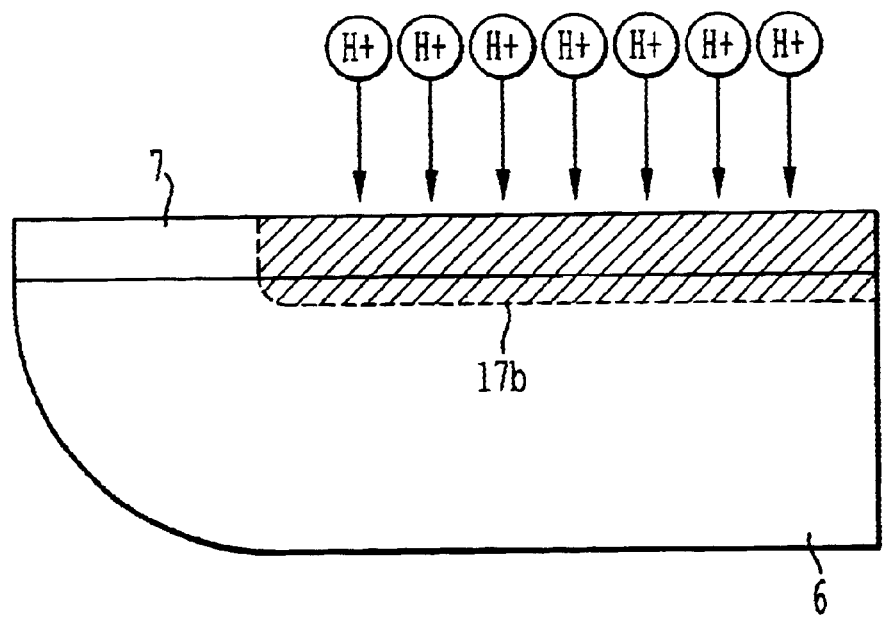
FIG. 10 is an enlarged sectional view of the antireflection coating side of the InGaAsP contact layer shown in FIG. 9.

FIG. 9 is a vertical sectional view in the longitudinal direction of the semiconductor laser device according to a sixth embodiment of the present invention. As described in the fifth embodiment in FIG. 8 above, the non-current injection area E1 is formed by the n-type diffusion region 17a in the cladding layer 6. However, in FIG. 8, the non-current injection area is formed by providing a high resistance are 17b in the cladding layer 6. Specifically, as shown in FIG. 10, protons (H+) are ion implanted along the diffraction grating 13 to change the contact layer 7 and a portion of the cladding layer 6 to a high resistance region 17b in the area Li of the diffraction grating 13. Therefore, current injection to the vicinity of the diffraction grating 13 is suppressed, without providing a separate n-InP layer 18. The diffraction grating 13 of the sixth embodiment has a length Lg=50 μm and the area Li where diffusion is made is 60 μm. Therefore, current injection to the vicinity of the diffraction grating 13 is suppressed, thereby achieving the same advantages described with respect to the first embodiment above.

Figure 11:
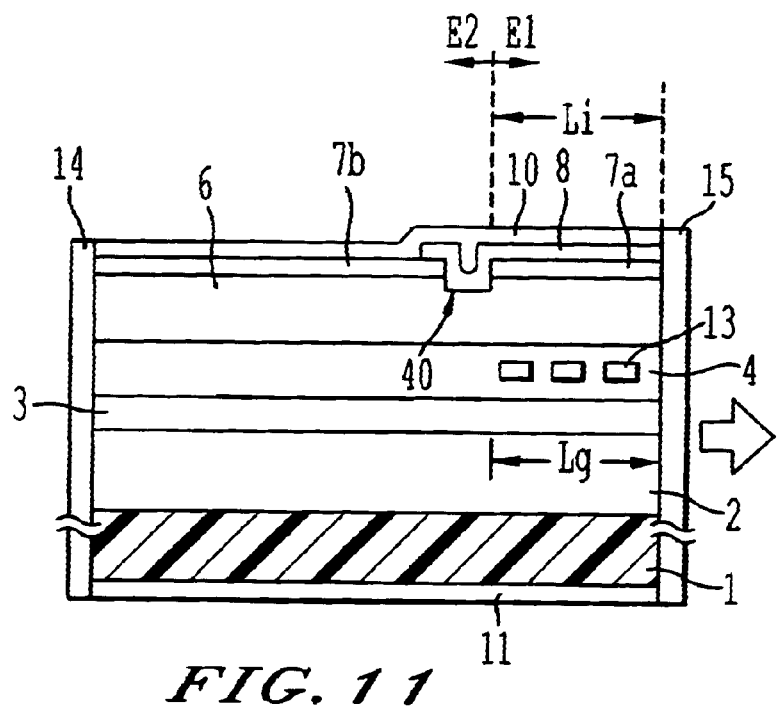
FIG. 11 is a vertical sectional view in the longitudinal direction of a semiconductor laser device according to the seventh embodiment of the present invention.

FIG. 11 is a vertical sectional view in the longitudinal direction of the semiconductor laser device according to a seventh embodiment of the present invention. In the first embodiment described in FIG. 5 above, an insulating film 8 is provided along the diffraction grating 13 to form the non-current injection area E1. As seen in FIG. 11, however, the seventh embodiment includes a slot 40, which bifurcates the contact layer 7 and further suppresses injection current in the area of the diffraction grating 13. Specifically, contact layers 7a and 7b are formed upon the cladding layer 6 of the semiconductor device such that a lateral spacing exists between the two parts of the contact layer. In addition, a part of a p-InP cladding layer 6 is scraped beneath the lateral spacing to form a slot 40 in the contact layer 7 and cladding layer 6. After the slot 40 is formed, an insulating film 8 is formed upon the InGaAsP contact layers 7a and 7b, and on the cladding layer 6 within the slot 40. A p-side electrode 10 is formed on each upper surface of the insulating film 8 and the InGaAsP contact layer 7b. The diffraction grating 13 of the third embodiment has a length Lg=50 μm and the area Li where the contact layer 7a ends and the slot 40 begins is approximately 60 μm. The slot 40 prevents current injected in the current injection area E2 from flowing laterally into the non-current injection area E1. Therefore, non-current injection area E1 is formed along the diffraction grating thereby achieving the same advantages described with respect to the first embodiment above.

Figure 12:
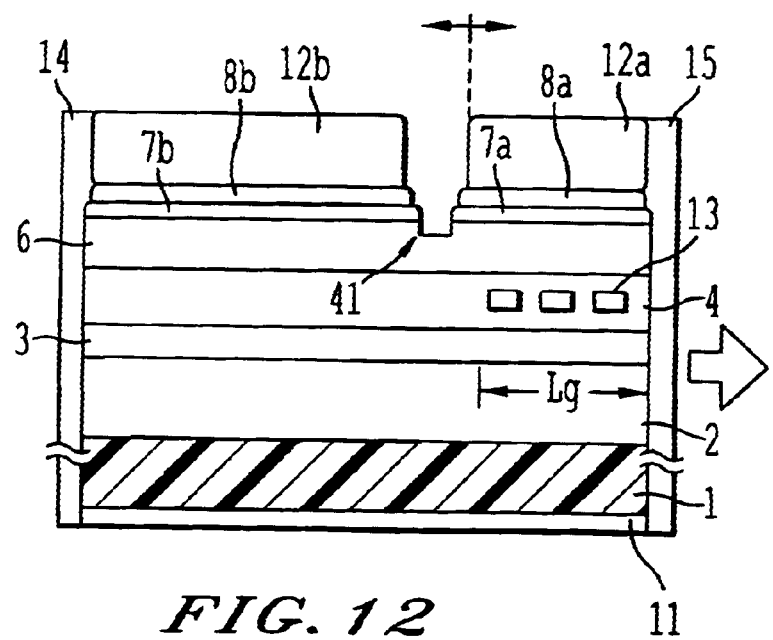
FIG. 12 is a vertical sectional view in the longitudinal direction of a semiconductor laser device according to the eighth embodiment of the present invention.

FIG. 12 is a vertical sectional view in the longitudinal direction of the semiconductor laser device according to an eighth embodiment of the present invention. In the seventh embodiment described in FIG. 11 above, a slot 40 that bifurcates the contact layer 7 is provided. As seen in FIG. 12, however, the eighth embodiment includes a slot 41 that bifurcates the contact layer 7a and 7b, and the the electrodes 8a and 8b to suppress injection current in the area of the diffraction grating 13. Specifically, the slot 41 is formed by forming the InGaAsP contact layer 7 corresponding to the InGaAsP contact layers 7a and 7b over the whole upper surface of this p-InP cladding layer 6 and etching the InGaAsP contact layer 7 to form a lateral spacing in the desired area of the slot 41. In addition, a part of a p-InP cladding layer 6 is scraped beneath the lateral spacing. Thereafter, electrodes 8a and 8b are formed on each upper surface of the InGaAsP contact layers 7a, 7b, and plating 12a, 12b is further formed thereon, respectively. The plating 12b forms a p-side electrode, and a wire (not shown) for energizing the injected current is bonded on the plating 12b. The plating 12a does not include a wire and therefore is not energized. The diffraction grating 13 of the third embodiment has a length Lg=50 μm and the area where the contact layer 7a, electrode 8a, and plate 12a approximately end and the slot 41 begins forms the non-current injection area which is approximately 60 μm. The slot 41 prevents current injected in the current injection area E2 from flowing laterally into the non-current injection area E1. Therefore, non-current injection area E1 is formed along the diffraction grating, thereby achieving the same advantages described with respect to the first embodiment above.

Figure 13:
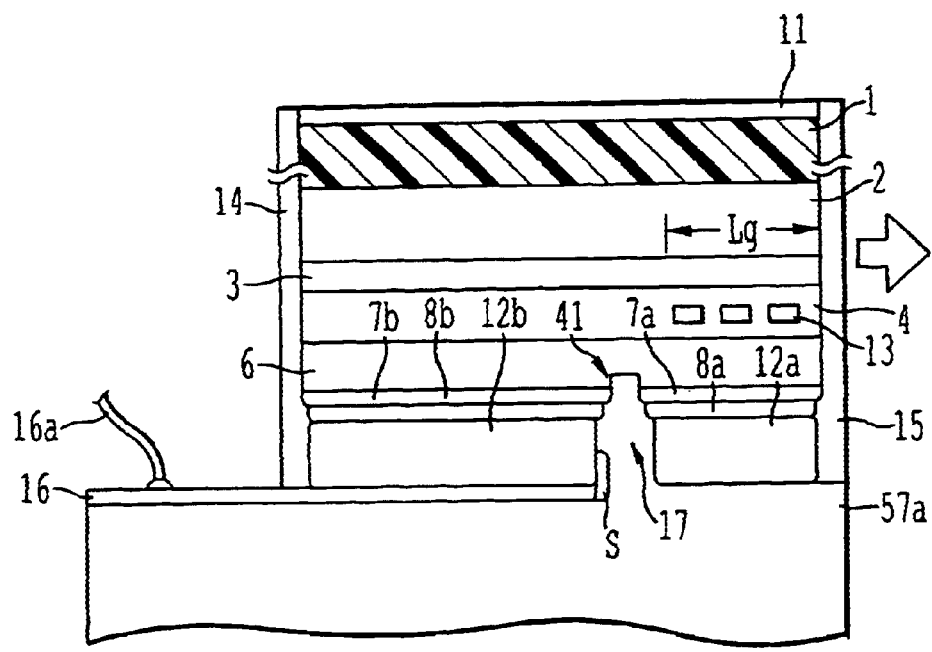
FIG. 13 is a vertical sectional view in the longitudinal direction of a semiconductor laser device according to the ninth embodiment of the present invention.

As shown in FIG. 13, the semiconductor laser device shown in FIG. 12 is normally used with the plating 12a, 12b joined to the heat sink 57a in a "junction down" configuration. With the junction down method, the GRIN-SCH-MQW active layer 3 as the heat generation source is arranged on the plating 12a, 12b close to the heat sink 57 thereby making temperature control easy. However, if the construction of the semiconductor laser device shown in FIG. 13 is directly placed with the junction down, conduction occurs between the plating 12a and the plating 12b. Therefore, a conduction pattern 16 is formed using Au in the portion where the heat sink 57a is brought into contact with the plating 12b. Here, since the heat sink 57a is formed of an insulating material and has high thermal conductivity, insulation is effected between the plating 12a side and the plating 12b side. The plating 12a, the electrode 8a and the InGaAsP contact layer 7a have high thermal conductivity, and hence can efficiently conduct the heat on the non-current injection area E1 side to the heat sink 57a side. The conduction pattern 16 extends on the heat sink 57a, except for the junction portion of the semiconductor laser device and the heat sink 57a, and is bonded with a wire 16a, to thereby supply injected current. By adopting such a junction down method, since the GRIN-SCH-MQW active layer 3 having high thermal conductivity can be brought close to the heat sink 57a, as described above, the temperature control of the semiconductor laser device 20 becomes easy, and hence the output stability can be further maintained. In addition the trench 17 provides a sink for collecting spread solder when the laser device is joined with the heat sink thereby preventing the wraparound discussed above with respect to FIG. 1. That is, as seen in FIG. 13, extra solder S from this process is trapped in the trench without causing a short circuit between the plating 12a and the plating 12b.

Moreover, in all the embodiments described above or the embodiments that will be described below, it is desired to adopt the junction down method. This is because the temperature control of the semiconductor laser device 20 becomes easy, and hence the output stability can be further maintained, as described above.

Figure 14:
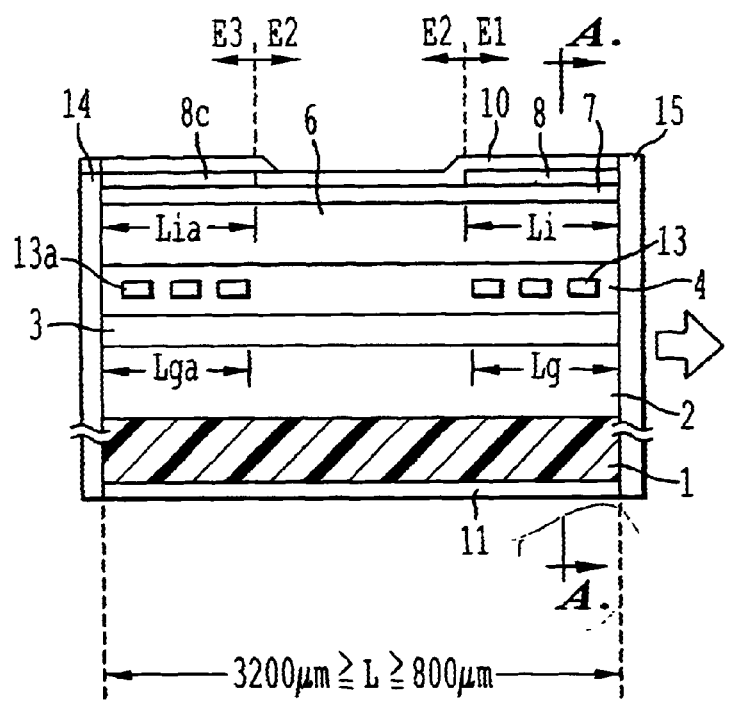
FIG. 14 is a vertical sectional view in the longitudinal direction of a semiconductor laser device according to the tenth embodiment of the present invention.

FIG. 14 is a vertical sectional view in the longitudinal direction of the semiconductor laser device according to a ninth eighth embodiment of the present invention. In all of the embodiments previously discussed, the semiconductor laser device included a non-current injection area on the light emitting side of the device. However, as seen in FIG. 14, the semiconductor laser device of the ninth embodiment also includes a diffraction grating 13a, having a length Lga, positioned on the light reflecting side of the device. For example, as shown in FIG. 14, the non-current injection areas E1 and E3 are produced by insulating layers 8 and 8c respectively. The insulating film 8c is provided in order to prevent a decrease of the refractive index of the diffraction grating 13a. This insulating film 8c is provided on the upper part of the diffraction grating 13a and between a p-InP cladding layer 6 and a p-side electrode 10, similar to the insulating film 8, and has a length Lia. This length Lia has the same relation as that of between the length Lg and the length Li, and is set so as to have a minimum length that can cover the length Lga. In order that the diffraction grating 13a on the reflection coating 14 side has the wavelength selectivity and the reflection characteristic, the product of a coupling coefficient κ and the length Lga may be set to be a large value, for example, "2" or larger.

Thereby, a non-current injection area E3 can be formed on the diffraction grating 13a side, to thereby suppress the inflow of the current injection to the vicinity of the diffraction grating 13a. As a result, as in the first embodiment, the monitor current is made stable with respect to the optical output, and the optical amplification control becomes simple and easy, even with a semiconductor laser device having a high output. Moreover, deterioration of the facet at the facet on the reflection coating 14 can be prevented. Even with a semiconductor laser device provided with only the diffraction grating 13a, by applying this ninth embodiment, the monitor current is made stable with respect to the optical output, and the optical amplification control becomes simple and easy, even with a semiconductor laser device having a high output.

In each of the embodiments described above, the periodically spaced material of the diffraction grating 13 is equally spaced and has a constant pitch. However, it is to be understood that the grating material may have different spacings and pitches in order to achieve the desired multiple oscillation modes output from the laser device. Moreover it is to be understood that the two non-current injection areas of FIG. 14 may be provided by any of the previously described embodiments and is not limited to the insulating layer embodiment shown in FIG. 14.

Figure 15:
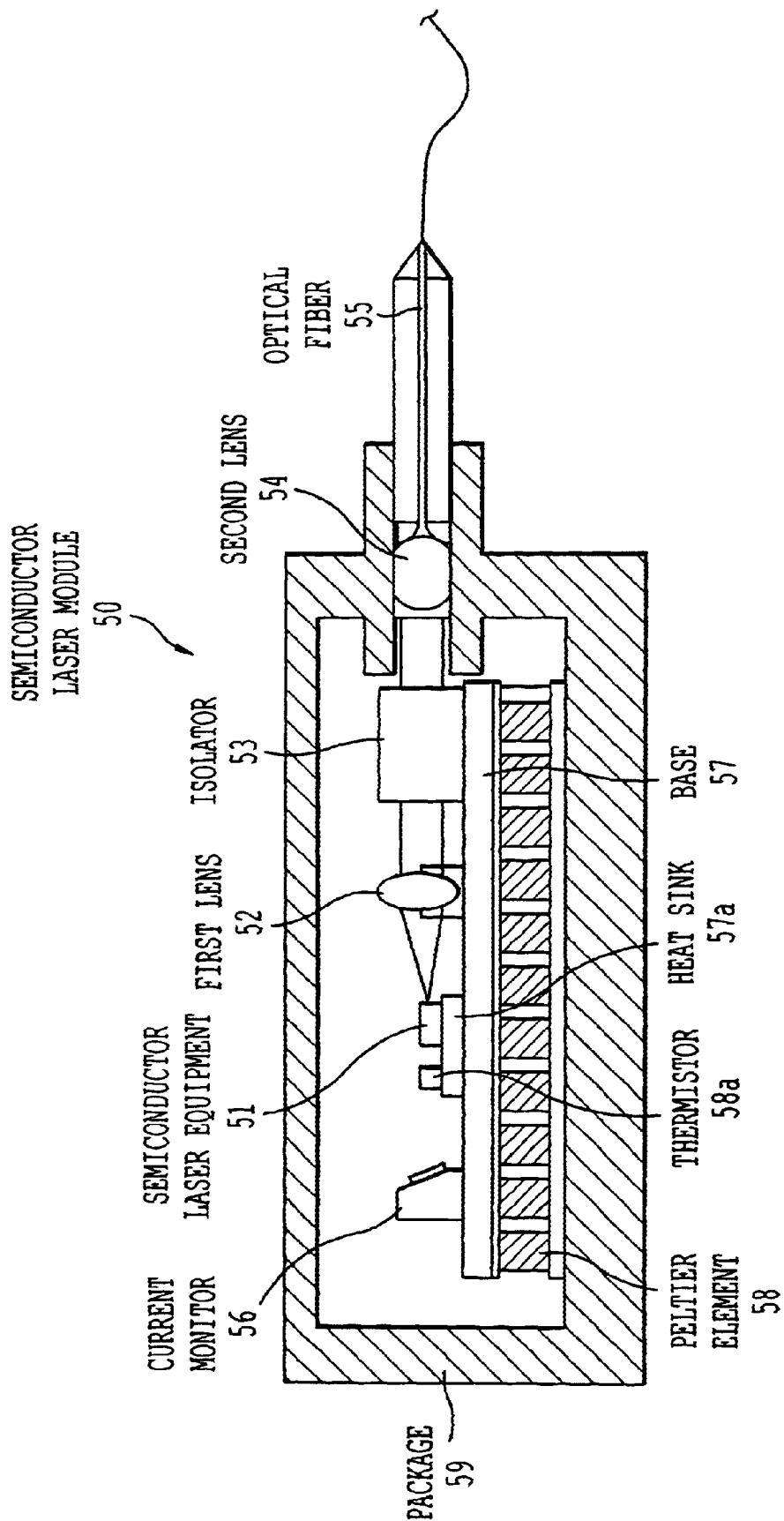
FIG. 15 is a vertical sectional view illustrating a configuration of a semiconductor laser module in accordance with the present invention.

FIG. 15 is a vertical sectional view illustrating the configuration of a semiconductor laser module having a semiconductor laser device according to the present invention. The semiconductor laser module 50 includes a semiconductor laser device 51, a first lens 52, an internal isolator 53, a second lens 54 and an optical fiber 55. Semiconductor laser device 51 is an integrated grating device configured in accordance with any of the above-described semiconductor laser devices and a laser beam irradiated from the semiconductor laser device 51 is guided to optical fiber 55 via first lens 52, internal isolator 53, and second lens 54. The second lens 54 is provided on the optical axis of the laser beam and is optically coupled with the optical fiber 55.

The semiconductor laser device 51 is preferably provided in a junction down configuration in which the p-side electrode is joined to the heat sink 57a, which is mounted on the base 57. A back face monitor photo diode 56 is also disposed on a base 57 which functions as a heat sink and is attached to a temperature control device 58 mounted on the metal package 59 of the laser module 50. The back face monitor photo diode 56 acts as a current monitor to detect a light leakage from the reflection coating side of the semiconductor laser device 51. As described above, this monitor current is used to control the light output of the laser module to therby control the gain of the Raman amplifier. Because the laser device 51 includes a non-current injection area according to the present invention, the monitor current will increase monotonically with an increase in laser device output thereby facilitating control of the laser device output and thus the Raman gain.

The temperature control device 58 is a Peltier module. Although current (not shown) is given to the Peltier module 58 to perform cooling and heating by its polarity, the Peltier module 58 functions mainly as a cooler in order to prevent an oscillation wavelength shift by the increase of temperature of the semiconductor laser device 51. That is, if a laser beam has a longer wavelength compared with a desired wavelength, the Peltier element 58 cools the semiconductor laser device 51 and controls it at a low temperature, and if a laser beam has a shorter wavelength compared with a desired wavelength, the Peltier element 58 heats the semiconductor laser device 51 and controls it at a high temperature. By performing such a temperature control, the wavelength stability of the semiconductor laser device can improved. Alternatively, a thermistor 58a can be used to control the characteristics of the laser device. If the temperature of the laser device measured by a thermistor 58a located in the vicinity of the laser device 51 is higher, the Peltier module 58 cools the semiconductor laser device 51, and if the temperature is lower, the Peltier module 58 heats the semiconductor laser device 51. By performing such a temperature control, the wavelength and the output power intensity of the semiconductor laser device are stabilized.

Figure 16:
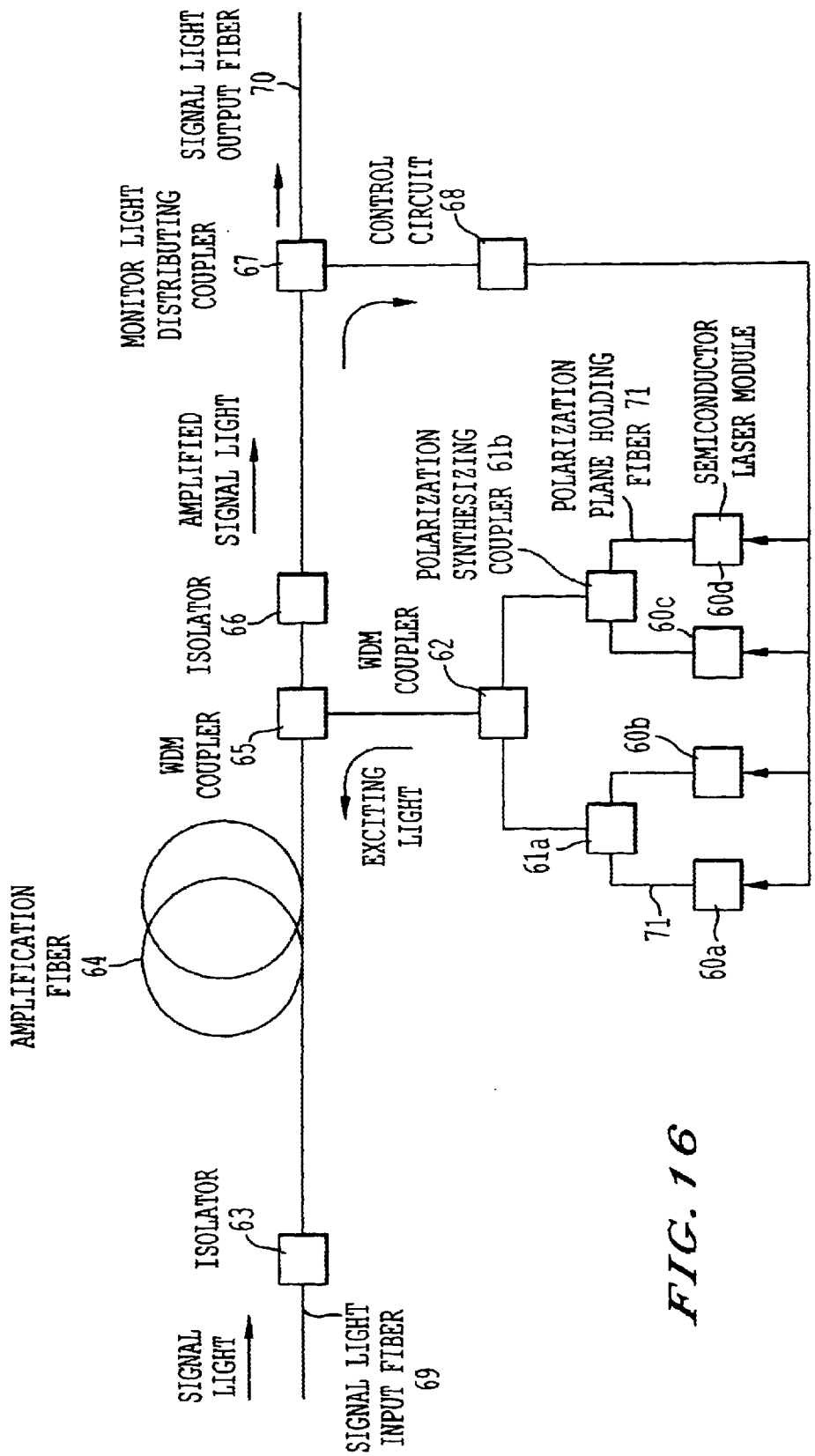
FIG. 16 is a block diagram illustrating a configuration of a Raman amplifier in which polarization dependency is canceled by polarization-multiplexing of pumping light beams output from two semiconductor laser devices, in accordance with an embodiment of the present invention.

FIG. 16 is a block diagram illustrating a configuration of a Raman amplifier used in a WDM communication system in accordance with the present invention. In FIG. 16, semiconductor laser modules 60a through 60d are of the type described in the embodiment of FIG. 15. The laser modules 60a and 60b output laser beams having the same wavelength via polarization maintaining fiber 71 to polarization-multiplexing coupler. Similarly, laser beams outputted by each of the semiconductor laser modules 60c and 60d have the same wavelength, and they are polarization-multiplexed by the polarization-multiplexing coupler 61b. Each of the laser modules 60a through 60d outputs a laser beam having a plurality of oscillation longitudinal modes in accordance with the present invention to a respective polarization-multiplexing coupler 61a and 61b via a polarization maintaining fiber 71.

Polarization-multiplexing couplers 61a and 61b output polarization-multiplexed laser beams having different wavelengths to a WDM coupler 62. The WDM coupler 62 multiplexes the laser beams outputted from the polarization multiplexing couplers 61a and 61b, and outputs the multiplexed light beams as a pumping light beam to amplifying fiber 64 via WDM coupler 65. Signal light beams to be amplified are input to amplifying fiber 64 from signal light inputting fiber 69 via isolator 63. The amplified signal light beams are Raman-amplified by being multiplexed with the pumping light beams and input to a monitor light branching coupler 67 via the WDM coupler 65 and the polarization-independent isolator 66. The monitor light branching coupler 67 outputs a portion of the amplified signal light beams to a control circuit 68, and the remaining amplified signal light beams as an output laser beam to signal light outputting fiber 70.

The control circuit 68 controls a light-emitting state, for example, an optical intensity, of each of the semiconductor laser module 60a through 60d based on the portion of the amplified signal light beams input to the control circuit 68. This optical intensity of the Raman amplifier output is used along with the monitor current photodiode 56 of the laser module in FIG. 15 to control the output of the semiconductor lasers of each module. Thus, control circuit 68 performs feedback control of a gain band of the Raman amplification such that the gain band will be flat over wavelength.

Figure 17:
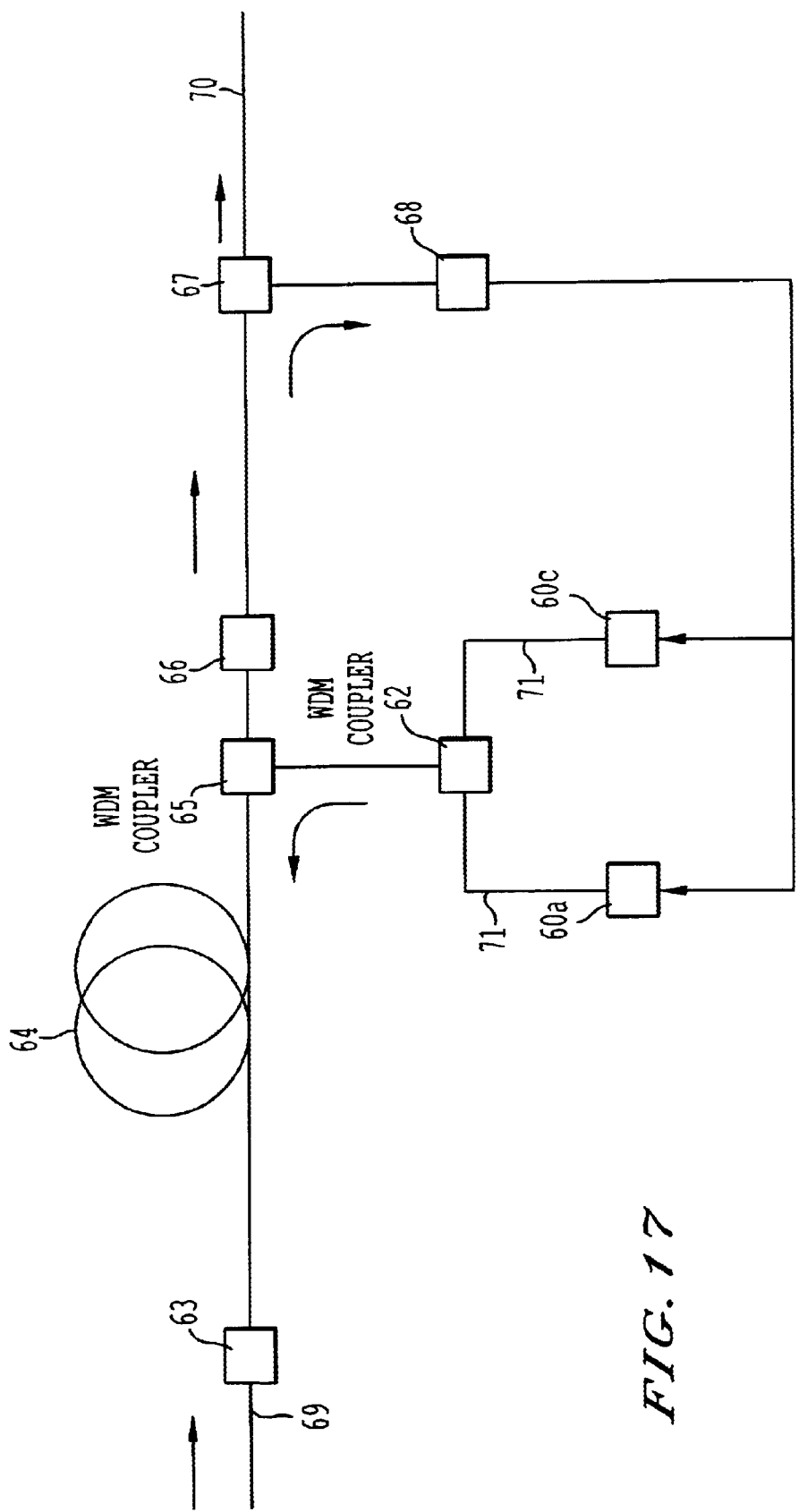
FIG. 17 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention.

Although the Raman amplifier illustrated in FIG. 16 is the backward pumping method, it is to be understood that the semiconductor laser device, module and Raman amplifier of the present invention may be used with a forward pumping method or the bi-directional pumping method. Moreover, the Raman amplifier can be constructed by wavelength-multiplexing of a plurality of pumping light sources which are not polarization-multiplexed. That is, the semiconductor laser module of the present invention can be used in a Raman amplifier where the polarization-multiplexing of pumping light is not performed. FIG. 17 is a block diagram illustrating a configuration of a Raman amplifier in which polarization dependency is canceled by depolarizing a pumping light beam output from a single semiconductor laser device using polarization maintaining fibers as a depolarizer, in accordance with an embodiment of the present invention. As seen in this figure, laser modules 60A and 60C are directly connected to WDM coupler 62 via a polarization maintaining fiber 71. In this configuration, the angle of the polarization axis of the polarization maintaining fiber against the emitted light from semiconductor laser device is approximately 45 degrees.

Figure 18:
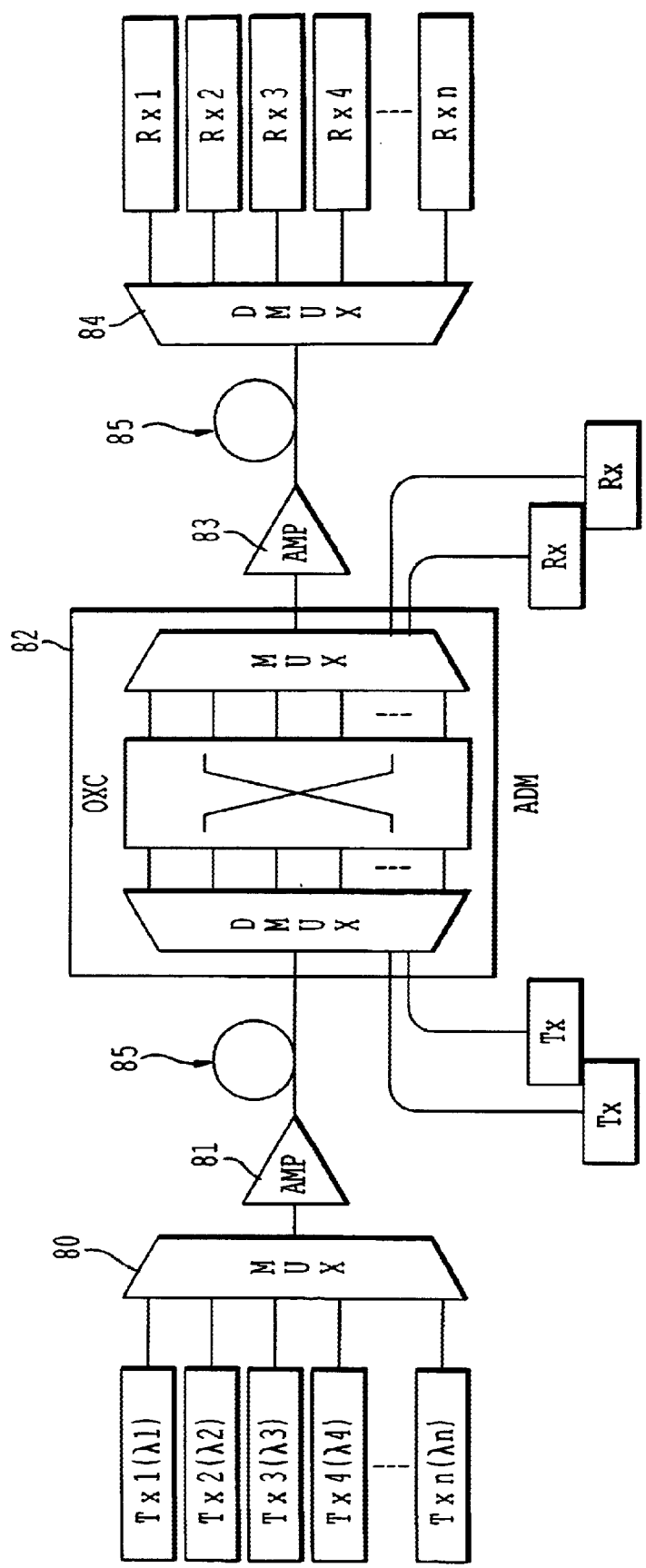
FIG. 18 is a block diagram illustrating a general configuration of a WDM communication system in which the Raman amplifier shown in FIGS. 16 and 17 are used.
Figure 19:
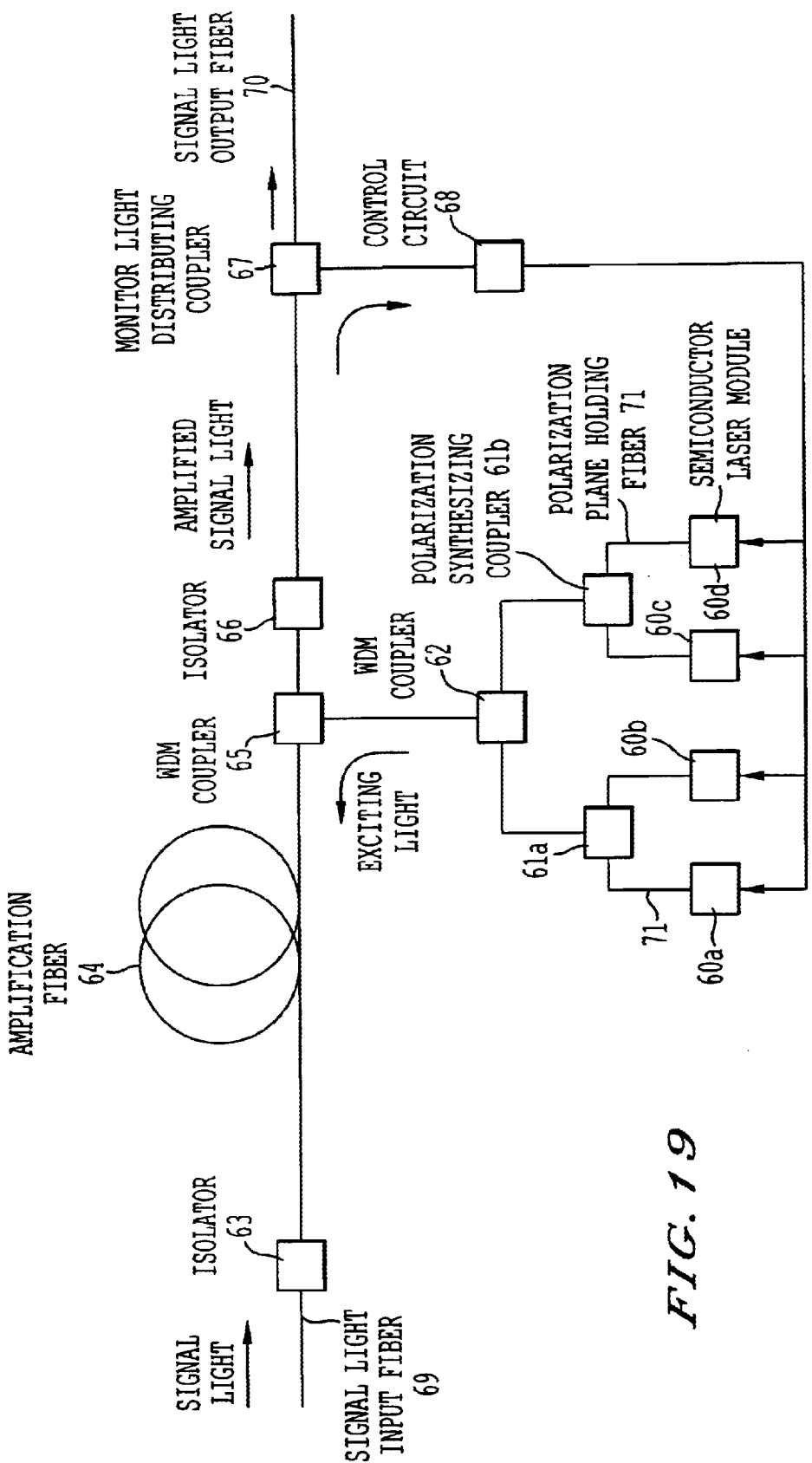
FIG. 19 is a block diagram showing a schematic construction of a Raman amplifier having a semiconductor laser device having an integrated diffraction grating.

The Raman amplifier illustrated in FIGS. 16 and 17 can be applied to the WDM communication system as described above. FIG. 18 is a block diagram illustrating a general configuration of the WDM communication system to which the Raman amplifier shown in either FIG. 16 or FIG. 17 is applied.

In FIG. 18, optical signals of wavelengths $\lambda_1$ through $\lambda_n$ are forwarded from a plurality of transmitter $Tx_1$ through $Tx_n$ to multiplexing coupler 80 where they are wavelength-multiplexed and output to optical fiber 85 line for transmission to a remote communications unit. On a transmission route of the optical fiber 85, a plurality of Raman amplifiers 81 and 83 corresponding to the Raman amplifier illustrated in FIG. 21 or FIG. 22 are disposed amplifying an attenuated optical signal. A signal transmitted on the optical fiber 85 is divided by an optical demultiplexer 84 into optical signals of a plurality of wavelengths $\lambda_1$ through $\lambda_n$, which are received by a plurality of receivers $Rx_1$ through $Rx_n$. Further, an ADM (Add/Drop Multiplexer) may be inserted on the optical fiber 85 for inserting and removing an optical signal of an arbitrary wavelength.

Obviously, numerous modifications and variations of the present invention are possible in light of the above teachings. It is therefore to be understood that within the scope of the appended claims, the invention may be practiced otherwise than as specifically described herein. For example, the present invention has been described as a pumping light source for the Raman amplification, it is evident that the configuration is not limited to this usage and may be used as an EDFA pumping light source of the oscillation wavelength of 980 nm and 1480 nm.

What is claimed is:

1. A semiconductor device comprising:
   an active region having a length and configured to radiate light in the presence of an injection current;
   a light reflecting facet positioned on a first side of said active region;
   a light emitting facet positioned on a second side of said active region thereby forming a resonator between said light reflecting facet and said light emitting facet;
   a diffraction grating positioned within said resonator along a first portion of the length of said active region; and
   a non-current injection area formed along said diffraction grating so as to suppress injection current in said first portion of the length of the active region.

2. The semiconductor laser device of claim 1, wherein said non-current injection area has a length Li greater than a length Lg of said diffraction grating.

3. The semiconductor device of claim 2 wherein Li is larger than Lg by an amount necessary to prevent scatter injection current from affecting the diffraction grating.

4. The semiconductor laser device of claim 1, wherein said diffraction grating is provided in the vicinity of said light reflecting facet.

5. The semiconductor laser device of claim 1, wherein said diffraction grating is provided in the vicinity of said light emitting, facet.

6. The semiconductor laser device of claim 1, wherein said diffraction grating is provided in the vicinity of said light reflecting facet, and a second diffraction grating is provided in the vicinity of said light emitting facet.

7. The semiconductor laser device of claim 1, wherein said non-current injection area comprises an insulating film formed along said diffraction grating.

8. The semiconductor laser device of claim 1, further comprising an electrode formed along said resonator and configured to input said injection current to said semiconductor device, wherein said non-current injection area comprises an area along said diffraction grating where the electrode is excluded.

9. The semiconductor laser device of claim 1, further comprising a contact layer formed along said resonator and configured to reduce resistance to said injection current, wherein said non-current injection area comprises an area along said diffraction grating where said contact layer is excluded.

10. The semiconductor laser device of claim 1, further comprising a contact layer formed along said resonator and configured to reduce resistance to said injection current, wherein said non-current injection area comprises a current blocking layer formed on said contact layer in an area along said diffraction grating, said current blocking layer forming a diode junction that blocks the injection current.

11. The semiconductor laser device of claim 10, wherein said current blocking layer comprises a single or multi layer film of semiconductor materials selected from the group comprising InP, InGaAsP, GaAs, and InGaAs.

12. The semiconductor laser device of claim 1, further comprising a contact layer formed along said resonator and configured to reduce resistance to said injection current, wherein said non-current injection area comprises a semiconductor layer or multiple semiconductor layers formed on said contact layer in an area along said diffraction grating, said semiconductor layers having high contact resistance at the interface between said electrode and said semiconductor layers.

13. The semiconductor laser device of claim 1, further comprising:
a cladding layer formed along said resonator and configured to confine the light in said resonator; and
a contact layer formed on said cladding layer and configured to reduce resistance to said injection current, wherein said non-current injection area comprises an impurity region formed within said contact layer and cladding layer along said diffraction grating, said impurity region forming a diode junction that blocks the injection current.

14. The semiconductor laser device of claim 13, wherein said impurities comprise n-type impurities.

15. The semiconductor laser device of claim 1, further comprising:
a cladding layer formed along said resonator and configured to confine the light in said resonator; and
a contact layer formed on said cladding layer and configured to reduce resistance to said injection current, wherein said non-current injection area comprises an impurity region formed within said contact layer and cladding layer along said diffraction grating, said impurity region forming a high resistance region that blocks the injection current.

16. The semiconductor laser device of claim 15, wherein said impurities comprise protons.

17. The semiconductor laser device of claim 1, further comprising a contact layer formed along said resonator and configured to reduce resistance to said injection current, wherein said non-current injection area comprises an insulating film formed along said diffraction grating and having a slot portion that penetrates the contact layer to separate the contact layer into two parts.

18. The semiconductor laser device of claim 17, further comprising a cladding layer positioned between said contact layer and said resonator, wherein said slot penetrates into said cladding layer.

19. The semiconductor laser device of claim 1, further comprising:
a cladding layer formed along said resonator and configured to confine the light in said resonator;
a contact layer formed on said cladding layer and configured to reduce resistance to said injection current;
an electrode formed on said contact layer; and
a slot penetrating said electrode, contact layer, and cladding layer to bifurcate the electrode and contact layers thereby forming separate electrode structures, wherein said non-current injection area comprises one of said electrode structures to which no injection current is applied.

20. The semiconductor laser device of claim 19, further comprising a heat sink coupled to said electrode structures.

21. A method for providing light from a semiconductor device comprising:
radiating light from an active region of said device in the presence of an injection current;
providing a diffraction grating within a resonator of said device and positioned along a portion of the length of said active region; and
suppressing said injection current in said first portion of the length of the active region.

22. The method of claim 21, wherein said suppressing said injection current comprises providing a non-current injection area along said diffraction grating.

23. The method of claim 22, wherein said providing a non-current injection area comprises providing a non-current injection area having a length Li greater than a length Lg of said diffraction grating.

24. The method of claim 23, wherein said providing a non-current injection area comprises providing a non-current injection area having a length Li greater than a length Lg of said diffraction grating by an amount necessary to prevent scatter injection current from affecting the diffraction grating.

25. The method of claim 21, wherein said providing a diffraction grating comprises providing a diffraction grating in the vicinity of a light emitting facet of the device.

26. The method of claim 21, wherein said providing a diffraction grating comprises providing a diffraction grating in the vicinity of a light reflecting facet of the device.

27. The method of claim 21, wherein said providing a diffraction grating comprises providing a diffraction grating in the vicinity of a light reflecting facet of the device and providing a second diffraction grating in the vicinity of a light emitting facet of the device.

28. The method of claim 22, wherein said providing a non-current injection area comprises providing an insulating film along said diffraction grating.

29. The method of claim 22, further comprising providing an electrode formed along said resonator and configured to input said injection current to said semiconductor device, wherein said providing a non-current injection area comprises providing an area along said diffraction grating where the electrode is excluded.

30. The method of claim 22, further comprising providing a contact layer formed along said resonator and configured to reduce resistance to said injection current, wherein said providing a non-current injection area comprises providing an area along said diffraction grating where said contact layer is excluded.

31. The method of claim 22, further comprising providing a contact layer formed along said resonator and configured to reduce resistance to said injection current, wherein said non-current injection area comprises a current blocking layer formed on said contact layer in an area along said diffraction grating, said current blocking layer forming a diode junction that blocks the injection current.

32. The method of claim 22, further comprising:
providing a cladding layer formed along said active region and configured to confine the light in a resonator of said device; and
providing a contact layer formed on said cladding layer and configured to reduce resistance to said injection current, wherein said providing a non-current injection area comprises providing an impurity region within said contact layer and cladding layer along said diffraction grating, said impurity region forming a diode junction that blocks the injection current.

33. The method of claim 22, further comprising:
providing a cladding layer formed along said active region and configured to confine the light in a resonator of said device; and
providing a contact layer formed on said cladding layer and configured to reduce resistance to said injection current, wherein said providing a non-current injection area comprises providing an impurity region within said contact layer and cladding layer along said diffraction grating, said impurity region forming a high resistance region that blocks the injection current.

34. The method of claim 22, further comprising providing a contact layer formed along said active region and configured to reduce resistance to said injection current, wherein said providing a non-current injection area comprises providing an insulating film formed along said diffraction grating and having a slot portion that penetrates the contact layer to separate the contact layer into two parts.

35. The method of claim 22, further comprising:
providing a cladding layer formed along said active region and configured to confine the light in a resonator of said device;
providing a contact layer formed on said cladding layer and configured to reduce resistance to said injection current;
providing an electrode formed on said contact layer; and
providing a slot penetrating said electrode, contact layer, and cladding layer to bifurcate the electrode and contact layers thereby forming separate electrode structures, wherein said providing a non-current injection area comprises providing one of said electrode structures to which no injection current is applied, said one electrode structure having no injection current applied thereto.

36. A semiconductor device comprising:
means for radiating light from an active region of said device in the presence of an injection current;
means for selecting a portion of said radiated light to be emitted by said semiconductor laser device as an output light beam; and
means for suppressing said injection current in said first portion of the length of the active region.

37. A semiconductor laser module comprising:
a semiconductor laser device comprising:
an active region configured to radiate light in the presence of an injection current,
a light reflecting facet positioned on a first side of said active region,
a light emitting facet positioned on a second side of said active region thereby forming a resonator between said light reflecting facet and said light emitting facet,
a diffraction grating positioned within said resonator along a portion of the length of said active region, and
a non-current injection area formed along said diffraction grating so as to suppress injection current in said first portion of the length of the active region; and
a wave guide device for guiding said laser beam away from the semiconductor laser device.

38. An optical fiber amplifier comprising:
a semiconductor laser device comprising:
an active region configured to radiate light in the presence of an injection current,
a light reflecting facet positioned on a first side of said active region,
a light emitting facet positioned on a second side of said active region thereby forming a resonator between said light reflecting facet and said light emitting facet,
a diffraction grating positioned within said resonator along a portion of the length of said active region, and
a non-current injection area formed along said diffraction grating so as to suppress injection current in said first portion of the length of the active region; and
an amplifying fiber coupled to said semiconductor laser device and configured to amplify a signal by using said light beam as an excitation light.

39. A wavelength division multiplexing system comprising:
a transmission device configured to provide a plurality of optical signals having different wavelengths;
an optical fiber amplifier coupled to said transmission device and including a semiconductor laser device comprising:
an active region configured to radiate light in the presence of an injection current,
a light reflecting facet positioned on a first side of said active region,
a light emitting facet positioned on a second side of said active region thereby forming a resonator between said light reflecting facet and said light emitting facet, a diffraction grating positioned within said resonator along a portion of the length of said active region, and
a non-current injection area formed along said diffraction grating so as to suppress injection current in said first portion of the length of the active region; and
a receiving device coupled to said optical fiber amplifier and configured to receive said plurality of optical signals having different wavelengths.

40. A Raman amplifier comprising:
a semiconductor laser device comprising:
an active region configured to radiate light in the presence of an injection current,
a light reflecting facet positioned on a first side of said active region,
a light emitting facet positioned on a second side of said active region thereby forming a resonator between said light reflecting facet and said light emitting facet, a diffraction grating positioned within said resonator along a portion of the length of said active region, and
a non-current injection area formed along said diffraction grating so as to suppress injection current in said first portion of the length of the active region; and
a fiber coupled to said semiconductor laser device and configured to carry a signal that is amplified based on said light beam being applied to said fiber.

41. The Raman amplifier of claim 40, wherein said semiconductor laser device is coupled to said fiber at an input side of said fiber such that said light beam is applied in a forward pumping method.

42. The Raman amplifier of claim 40, wherein said semiconductor laser device is coupled to said fiber at an output side of said fiber such that said light beam is applied in a backward pumping method.

43. The Raman amplifier of claim 40, wherein said semiconductor laser device is coupled to said fiber at both an input and output side of said fiber such that said light beam is applied in both a forward and backward pumping method.

44. A semiconductor device comprising:
an active layer configured to radiate light in the presence of an injection current;
a light reflecting facet positioned on a first side of said active layer;
a light emitting facet positioned on a second side of said active layer thereby forming a resonator between said light reflecting facet and said light emitting facet;
a diffraction grating positioned within said resonator along a portion of the length of said active layer, wherein said semiconductor device is configured to emit a light beam having multiple longitudinal modes within the gain profile of the semiconductor device; and
a non-current injection area formed along said diffraction grating so as to suppress injection current in said portion of the length of the active layer.

\* \* \* \* \*